(12) United States Patent
Bandsmer

(10) Patent No.: US 8,756,029 B2
(45) Date of Patent: Jun. 17, 2014

(54) NON-LINEARITY CALIBRATION USING AN INTERNAL SOURCE IN AN INTELLIGENT ELECTRONIC DEVICE

(75) Inventor: Michael D. Bandsmer, Saanichton (CA)

(73) Assignee: Schneider Electric USA, Inc., Palatine, IL (US)

( * ) Notice: Subject to any disclaimer, the term of this patent is extended or adjusted under 35 U.S.C. 154(b) by 548 days.

(21) Appl. No.: 13/011,646

(22) Filed: Jan. 21, 2011

(65) Prior Publication Data

US 2012/0191395 A1   Jul. 26, 2012

(51) Int. Cl.
  *G01D 18/00*  (2006.01)
  *H03M 1/00*  (2006.01)

(52) U.S. Cl.
  USPC .......................................... 702/86; 341/140

(58) Field of Classification Search
  USPC ........... 702/86, 57, 60, 64–67, 70–73, 75–77,
    702/81, 84–85, 106, 127, 179, 182–183,
    702/188–190; 324/74, 76.11–76.13, 76.39,
    324/76.52, 76.55, 76.77, 76.82, 140 R,
    324/141–142; 341/111, 118, 120, 138, 140;
    700/286, 291, 293–294
  See application file for complete search history.

(56) References Cited

U.S. PATENT DOCUMENTS

| | | | | |
|---|---|---|---|---|
| 3,503,064 | A * | 3/1970 | Chikaraishi et al. | 341/140 |
| 5,006,790 | A | 4/1991 | Beverly, II et al. | 324/104 |
| 5,128,611 | A | 7/1992 | Konrad | 324/142 |
| 5,736,847 | A * | 4/1998 | Van Doorn et al. | 324/142 |
| 6,429,637 | B1 | 8/2002 | Gandhi | 324/74 |
| 6,735,535 | B1 | 5/2004 | Kagan et al. | 702/61 |
| 6,745,138 | B2 | 6/2004 | Przydatek et al. | 702/61 |
| 6,815,942 | B2 | 11/2004 | Randall et al. | 324/142 |
| 7,196,645 | B2 | 3/2007 | Bock | 341/120 |
| 7,660,682 | B2 | 2/2010 | Slota et al. | 702/57 |
| 2004/0169500 | A1 | 9/2004 | Jones | 324/142 |

FOREIGN PATENT DOCUMENTS

| | | | | |
|---|---|---|---|---|
| EP | 0 386 604 | A2 | 9/1990 | G01R 21/00 |
| EP | 0 386 604 | A3 | 7/1991 | G01R 21/00 |
| GB | 1563677 | | 3/1980 | G01R 35/00 |
| GB | 1575148 | | 9/1980 | G01R 21/00 |
| WO | WO 03/025596 | A2 | 3/2003 | G01R 31/00 |
| WO | WO 03/025596 | A3 | 3/2004 | G01R 35/00 |

OTHER PUBLICATIONS

Brent's method, obtained from http://en.wikipedia.org/wiki/Brents_method, Oct. 16, 2010, 4 pgs.

(Continued)

*Primary Examiner* — Toan Le
(74) *Attorney, Agent, or Firm* — Brinks Gilson & Lione

(57) ABSTRACT

An intelligent electronic device, and in particular, an electrical power meter, includes an internal calibration system capable of calibrating its measurement mechanisms for the integral nonlinearities introduced by the components which make up those mechanisms, in particular, the analog-to-digital converter. The analog-to-digital converter is coupled with at least one sensor which is operable to sense electrical energy in one or more conductors and output a corresponding electrical signal indicative thereof, the analog-to-digital converter being operative to convert the electrical signal output by the sensor to at least one corresponding digital signal. Integral non-linearity describes the deviation between the ideal output of an analog-to-digital converter and the actual output (after offset and gain errors have been removed). The intelligent electronic device, using internal INL calibration calibrates for such INL substantially across its entire measurement range and significantly improves the measurement accuracy thereby.

37 Claims, 21 Drawing Sheets

(56) References Cited

OTHER PUBLICATIONS

Integral nonlinearity, obtained from http://en.wikipedia.org/wiki/Integral_nonlinearity, Oct. 22, 2010, 1 pg.

INL/DNL Measurements for High-Speed Analog-to-Digital Converters (ADCs), Maxim, Sep. 1, 2000, 9 pgs.

Nagura, H., Fujino, K., "Correction Method for a Single Chip Power Meter," Instrumentation and Measurement Technology Conference, 1994, IMTC/94; Conference Proceedings, 10$^{th}$ Anniversary, Advanced Technologies in I & M, 1994, IEEE Hamamatsu, Japan May 10-12, 1994, New York, NY USA, IEEE, May 10, 1994, pp. 1313-1316, XP010121767, DOI: 10.1109/IMTC.1994.351815, ISBN: 978-0-7803-1880-9.

International Search Report and Written Opinion issued in PCT/US2012/021872, mailed Apr. 20, 2012, International Searching Authority of the European Patent Office, Rijswijk, the Netherlands (13 pgs.).

* cited by examiner

NON-LINEARITY CALIBRATION USING AN INTERNAL SOURCE IN AN INTELLIGENT ELECTRONIC DEVICE

BACKGROUND

In a typical electrical distribution system, electrical energy is generated by an electrical supplier or utility company and distributed to consumers via a power distribution network. The power distribution network is the network of electrical distribution wires which link the electrical supplier to its consumers. Typically, electricity from a utility is fed from a primary substation over a distribution cable to several local substations. At the substations, the supply is transformed by distribution transformers from a relatively high voltage on the distributor cable to a lower voltage at which it is supplied to the end consumer. From the substations, the power is provided to end consumers, such as industrial users, over a distributed power network that supplies power to various loads. Such loads may include, for example, various power machines or computer/electronic equipment.

At the consumer's facility, there will typically be an intelligent electronic device ("IED"), such as an electrical energy/watt-hour meter, connected between the consumer and the power distribution network so as to measure quantities such as the consumer's electrical consumption or electrical demand. Such a meter may be owned by the consumer and used to monitor and control consumption and report costs or may be owned by the utility and used to monitor consumption and report revenue.

An electrical power meter is generally an intelligent electronic device that records and measures electrical power consumption. Electrical power meters include, but are not limited to, electric watt-hour meters. In addition, electrical power meters are also capable of measuring and recording power events, such as brown outs, spikes, sags or swells, power quality, current, voltages waveforms, harmonics, transients or other power disturbances. Revenue accurate meters ("revenue meter") are revenue accuracy electrical power metering devices which may include the ability to detect, monitor, or report, quantify and communicate power quality information about the power which they are metering.

The electrical power meter is a critical part of the electric utility infrastructure. Meters keep track of the amount of electricity transferred at a specific location in the power system, most often at the point of service to a customer. Like the cash-register in a store, these customer meters are the place where the transaction occurs, where the consumer takes possession of the commodity, and where the basis for the bill is determined. Unlike a cash-register, however, the meter sits unguarded at the consumer's home and must be trusted, by both the utility and the home owner, to accurately and reliably measure and record the energy transaction.

Electricity is not like other commodities because it is consumed in real-time. There is nothing to compare or measure later, nothing to return, nothing tangible to show what was purchased. This makes the meter all the more critical for both the utility and the consumer. For this reason, electrical power meters and the sockets into which they are installed are designed to standards and codes that discourage tampering and provide means of detecting when it is attempted. Intentional abuses aside, the electrical power meter itself must be both accurate and dependable, maintaining its performance in spite of environmental and electrical stresses.

In more recent years the electric utility marketplace has moved towards deregulation where utility consumers will be able to choose electrical service providers. Until now, substantially all end users purchased electric power they needed from the local utility serving their geographic area. Further, there was no way for utilities to guarantee the same reliability to all consumers from the utility because of different connection points to the transmission and distribution lines. With deregulation it is essential for consumers to be able to measure and quantify power consumption and reliability from their suppliers in order to ensure they are receiving the service they have opted for. Such service may involve various pricing plans, for example on volume, term commitments, peak and off-peak usage or reliability.

Electrical power meter accuracy is typically measured as a function of the percentage of error in measurement over a particular measurement range. The accuracy rating of an electrical power meter is governed by defined industry and regulatory standards including American National Standards Institute (ANSI) C12.20 for North America and IEC 62053 for areas outside North America. The C12.20 standard establishes the physical aspects and performance criteria for a meter's accuracy class. Accuracy classes are defined and used in IEC and ANSI standards. Classes are denoted by either a letter or percentage. For example, Class B is a temperature accuracy from IEC-751 that requires accuracy of +/−0.15 degrees Celsius. Class 0.5 is an ANSI C12.20 accuracy class for electric meters with accuracy of +/−0.5%. Typically, accuracy is measured against a nominal (maximum) rated value and may vary at lower values.

Keeping in-step with the technology improvements associated with solid state metering, ANSI developed new standards with more stringent accuracy requirements during the late 1990's. ANSI C12.20 established Accuracy Classes 0.2 and 0.5, with the Class numbers representing the maximum percent metering error at normal loads. Typical residential solid state electricity meters are of Class 0.5, whereas electro-mechanical meters were typically built to the less stringent ANSI C12.1. In addition, C12.20 compliant meters are required to continue to meter down to 0.1 A (24 Watts), whereas C12.1 allowed metering to stop below 0.3 A (72 Watts). While metering of such low loads is not likely significant on a residential bill, it is an accuracy improvement nonetheless. The existing ANSI accuracy classes for electric meters are:

Class 0.5—having ±0.5% accuracy; and

Class 0.2—having ±0.2% accuracy.

Manufacturers and utilities use a range of tests and equipment to verify that meters adhere to the ANSI and IEC requirements. During the manufacturing process, it is common that each individual meter is calibrated and verified. Once a utility receives new meters, there is often another accuracy test, either on each meter or on a sample basis. States generally establish requirements for how utilities are to check accuracy when new meters are received and at intervals thereafter.

Various factors affect the accuracy of an electrical power meter, including environmental factors, such as temperature and/or humidity of the operating environment, internal factors, such as the quality and tolerances of the meter's components, and other factors such as the quality of the electrical power being monitored. To account for these various factors which affect accuracy, an electrical power meter typically undergoes a calibration process, performed by the manufacturer or by the consumer, by which the measurement mechanisms are tested under controlled conditions, any inaccuracies are determined and the adjustments are made so as to account for the measured inaccuracies during actual operation. Calibration processes may include calibration for gain errors, such as errors caused by component tolerances, offsets, such as offsets internally added to measured signals for internal uses, phase errors, such as errors caused by mismatched delay among measurement channels, drift, such as errors caused by components falling out of tolerance over time, and noise, such as noise injected into signals by the meter's components. Such calibration processes may be time consuming, thereby delaying manufacturing, and typically require highly accurate and costly external signal sources and measurement equipment.

DETAILED DESCRIPTION

Figure 1:
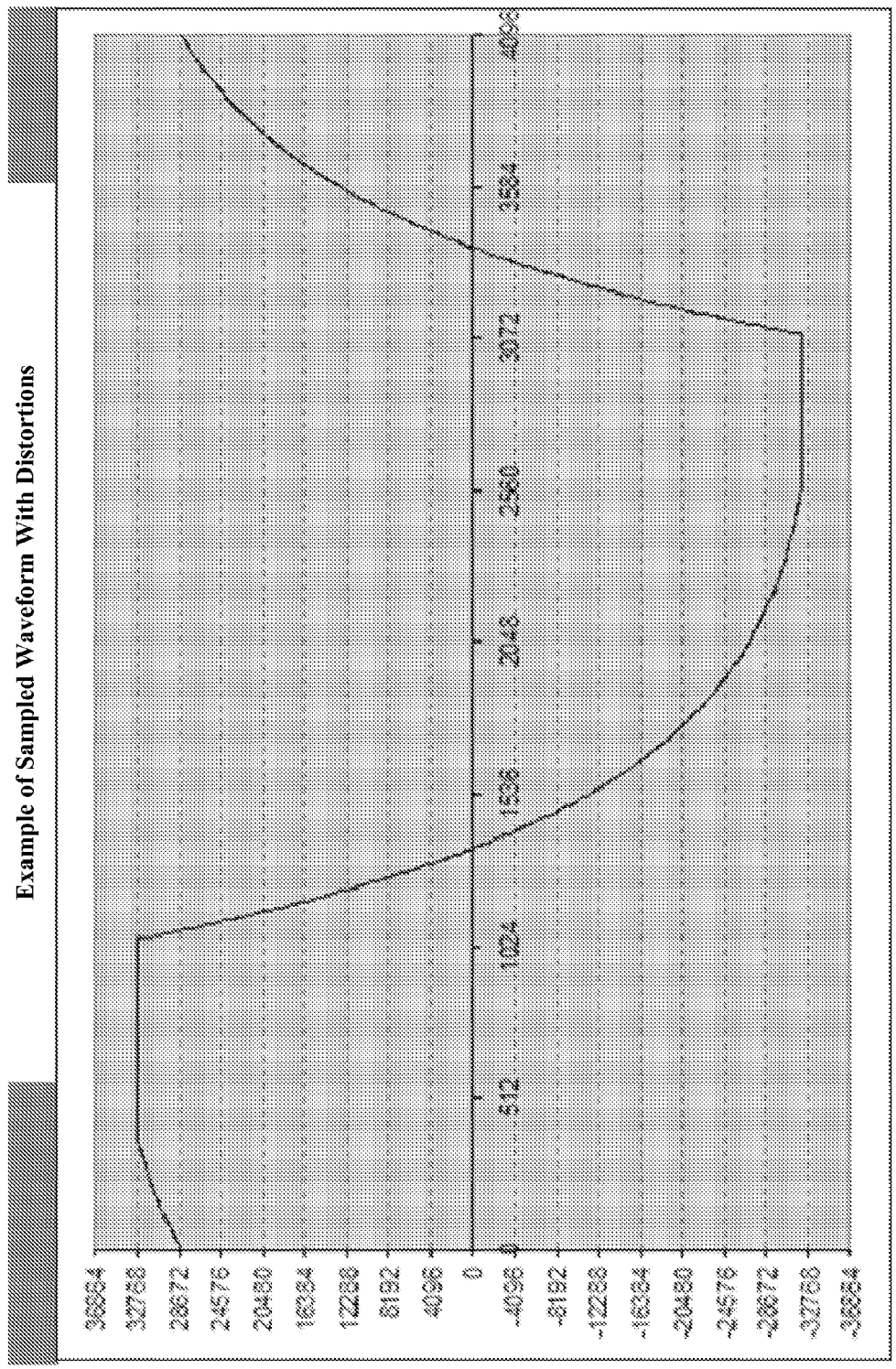
FIG. 1 depicts an exemplary sampled RC waveform for use with the disclosed embodiments.

The disclosed embodiments relate to an intelligent electronic device, and in particular, an electrical power meter, featuring an internal calibration system capable of calibrating its measurement mechanisms for the integral nonlinearities introduced by the components which make up those mechanisms, in particular, the analog-to-digital converter ("ADC"). The analog-to-digital converter is coupled with at least one sensor which is operable to sense electrical energy in one or more conductors and output a corresponding electrical signal indicative thereof, the analog-to-digital converter being operative to convert the electrical signal output by the at least one sensor to at least one corresponding digital signal. Integral non-linearity ("INL") is a term describing the deviation between the ideal output of an analog-to-digital converter and the actual output (after offset and gain errors have been removed). The disclosed embodiments further relate to an electrical power meter having internal non-linearity calibration using a relatively low cost low accuracy internal signal source, obviating the need for costly external signal sources or measurement systems, which quickly calibrates the electrical power meter for such non-linearities substantially across its entire measurement range and significantly improves the measurement accuracy thereby.

To clarify the use in the pending claims and to hereby provide notice to the public, the phrases "at least one of <A>, <B>, ... and <N>" or "at least one of <A>, <B>, ... <N>, or combinations thereof" are defined by the Applicant in the broadest sense, superceding any other implied definitions herebefore or hereinafter unless expressly asserted by the Applicant to the contrary, to mean one or more elements selected from the group comprising A, B, ... and N, that is to say, any combination of one or more of the elements A, B, ... or N including any one element alone or in combination with one or more of the other elements which may also include, in combination, additional elements not listed.

Other methods of calibrating an electrical power meter for non-linearities include using an undistorted external source to generate a waveform that the meter can use so as to analyze its own non-linearities and generate a correction table. However such external sources are expensive and require verification and maintenance. Alternatively, an external source may be used with an accurate reference that can capture the source waveform. However, there are technical challenges of synchronizing the meter's waveform with the reference's waveform capture and multiple cycles of the reference waveform may be needed to be "averaged" together to provide a reference of sufficient accuracy. There would also be considerable time overhead involved in downloading waveforms from the meter and/or reference.

Performing calibration external to the meter using a test set, with the meter simply recording and reporting its own readings, while the test set contains the logic to use those readings to generate calibration constants, provides the advantages that the calibration logic can be "upgraded" by simply upgrading the test set code, independent of the meter firmware and the meter code size can be reduced. However, to maintain this approach with INL calibration, i.e., to keep all of the calibration logic in the test set, may raise considerable technical difficulties, including transmitting many multicycle waveforms from the meter to the test set: Estimated time to transmit the calibration waveforms @ 19200 baud=15 waveforms*(4 cycles/waveform)*(1024 samples/cycle)*(4 bytes/sample)*(1/1920 sec/byte)=128 seconds. Thus, the waveform transmission time alone suggests that it is more efficient to have the calibration logic reside in the meter rather than the test set (and this does not even include the time it would take for the test set to write large lookup tables back to the meter).

Figure 2:
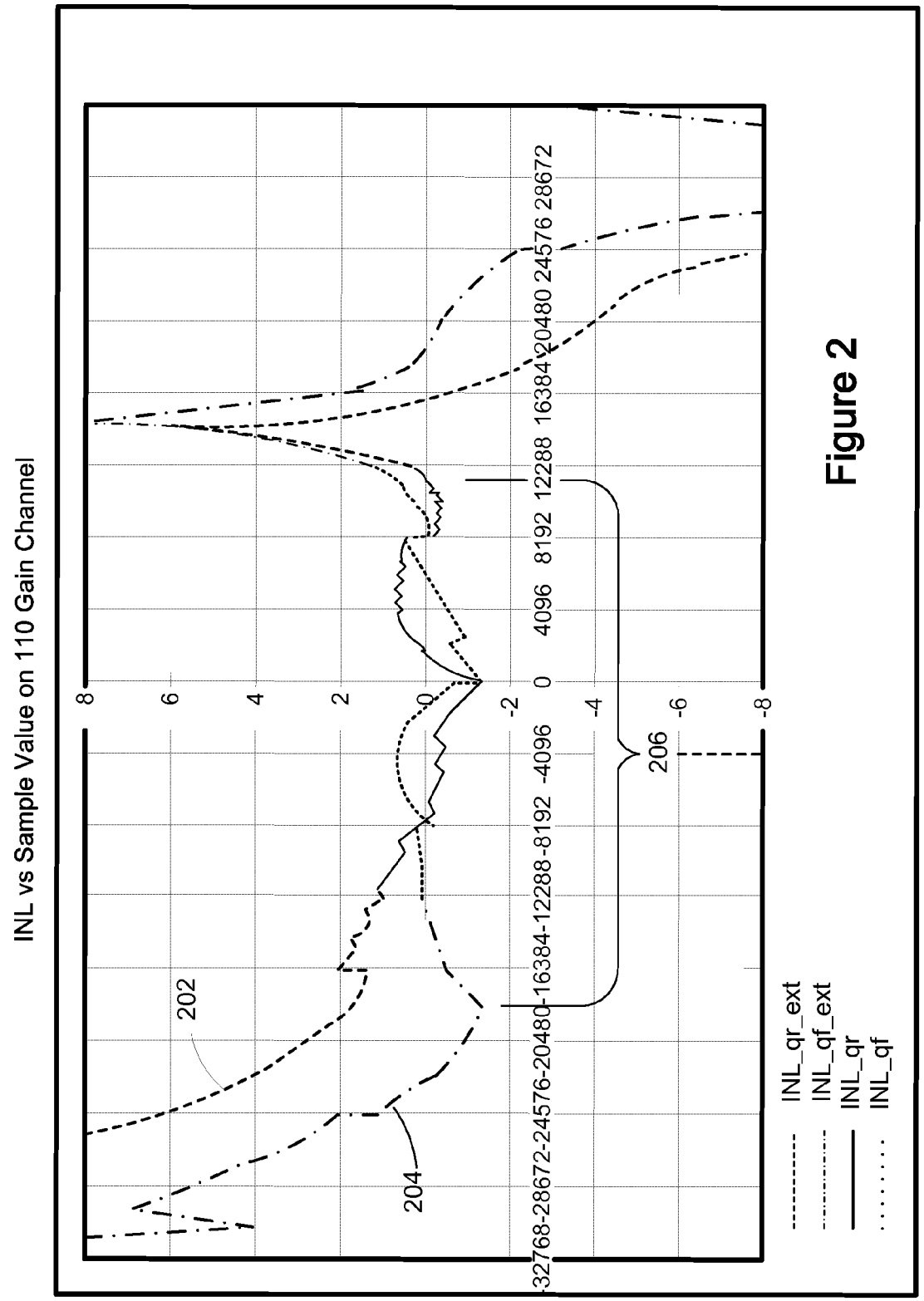
FIG. 2 depicts an exemplary graph of the distortions caused by integral non-linearities across the waveform of FIG. 1.
Figure 3:
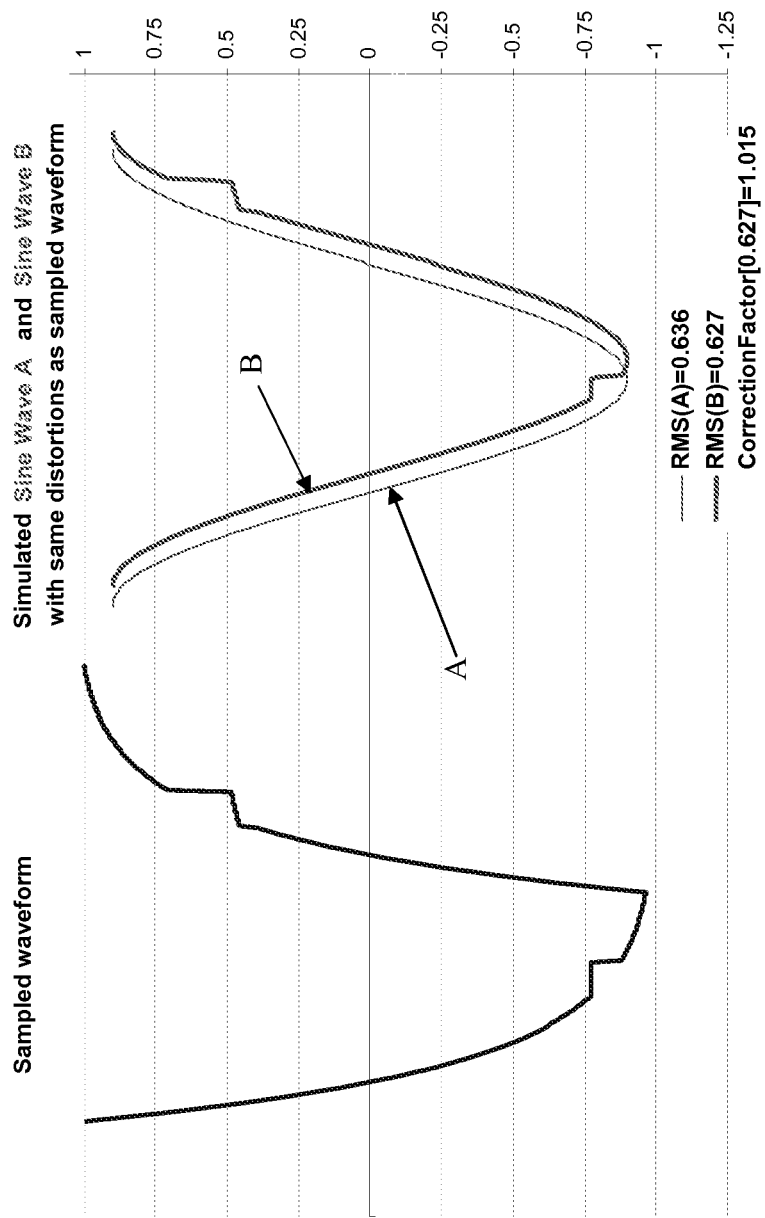
FIG. 3 depicts the application of the calculated distortions to a simulated sine wave A, calculating the RMS of the distorted sine wave B.

In general, the disclosed electrical power meter integral non-linearity calibration mechanism operates by generating a "clean" waveform internal to the meter, such as resistance-capacitance ("RC") decay waveform, which is then sampled after it has passed through the measurement circuitry of the meter. Multiple cycles of the waveform may then be accumulated in order to obtain sufficient resolution to correct for waveform distortions smaller than 1 least significant bit ("LSB") of the analog-to-digital converter of the meter. FIG. 1 shows an exemplary sampled waveform. Distortions in the sampled waveform are then calculated using, for example, a best-fit curve estimation for a clean part of the RC decay curve: $y_{bestfit}(t)$ curve, the distortions being calculated as: $INL(y_{bestfit}(t))=y_{sampled}(t)-y_{bestfit}(t)$. FIG. 2 shows an exemplary graph of the distortions caused by integral non-linearities across the sampled waveform. The calculated distortions are then applied, as shown in FIG. 3, to a simulated sine wave A, calculating the RMS of the distorted sine wave B. The correction factor is then given as: CorrectionFactor[RMS(B)] =RMS(A)/RMS(B). The application of the calculated distortions, and subsequent computation of the correction factor, are then repeated for simulated sine waves A that span the entire measurement range of the meter which results in generation of a table of correction factors for that gain channel.

To then make adjustments to real-time measurements during regular meter operation, RMS(B) is measured directly, permitting interpolation of a correction factor from the Correction Factor Table generated above. This correction factor is applied to RMS and power measurements.

The above calibration process is generally quick, taking approximately 10 seconds for 3 gain channels simultaneously. Generally, the circuits of the meter, for which integral non-linearities are to be determined and corrected for, should exhibit repeatable non-linearity. In one embodiment, the meter utilizes a digital to analog converter with firmware feedback to control the DC offset seen at the analog-digital-conversion channel. It may further be preferable that circuits be low-noise in order to detect waveform distortions smaller than 1 least-significant-bit of the analog-to-digital converter in a reasonable amount of time. It should be further noted that rising and falling INL's are not necessarily the same, due to various capacitances in the circuit interacting with the various non-linearity-introducing devices (op-amps, filter, and ADC). In an alternate embodiment, non-linearities in the source waveform itself may be overcome using different calibration waveforms for different parts of the correction table (i.e., multiple stages).

In one embodiment, this calibration is only used to calibrate current channels where voltage inputs on blade-powered meters may override any internally generated source on the voltages.

The disclosed embodiments provide the advantages of:
1. Being fast, and can theoretically "sweep" every current point at once;
2. Not requiring any external equipment which potentially enables a customer to re-calibrate the non-linearities if an interface is provided, or enables production to optimize calibration station time by performing this calibration step beforehand; and
3. The cost for a circuit which generates this internal source is very small (e.g., a resistance-capacitance circuit using a negative-positive-zero capacitor, and a digital to analog converter channel).

Figure 4:
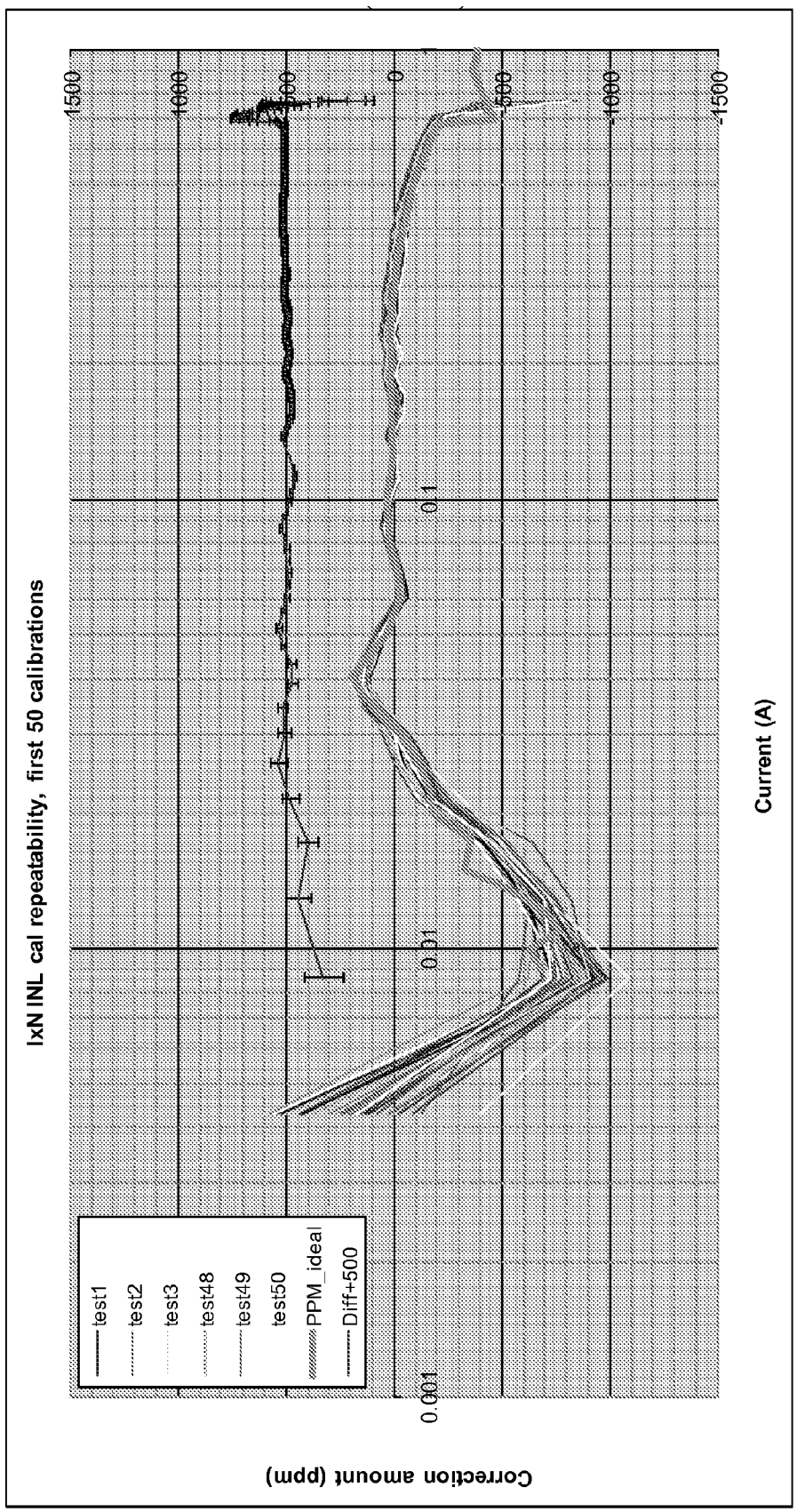
FIG. 4 depicts a typical integral calibration result for currents.
Figure 5:
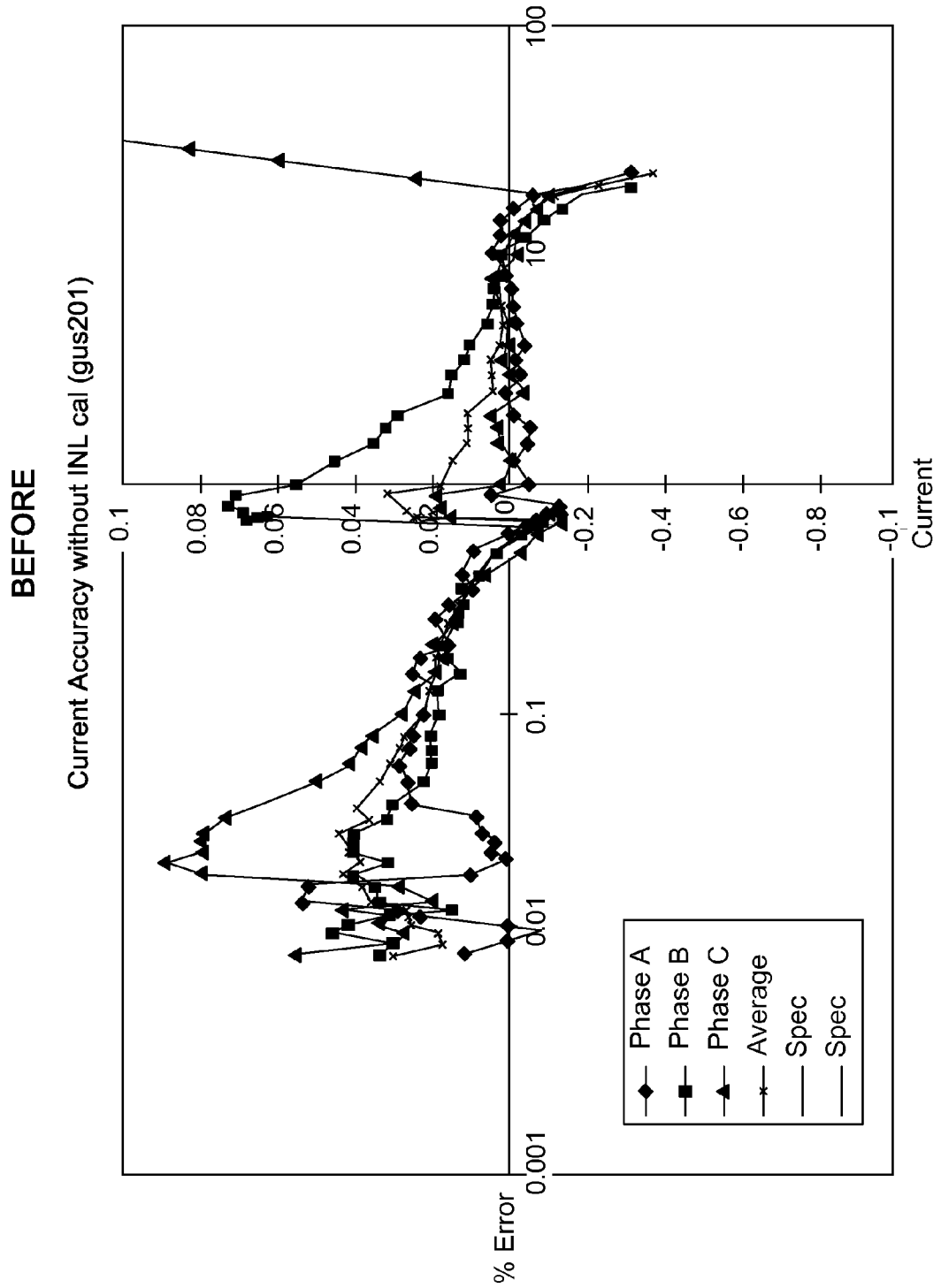
FIG. 5 depicts current accuracy of an exemplary electric power meter before calibration for integral non-linearities according to the disclosed embodiments.
Figure 6:
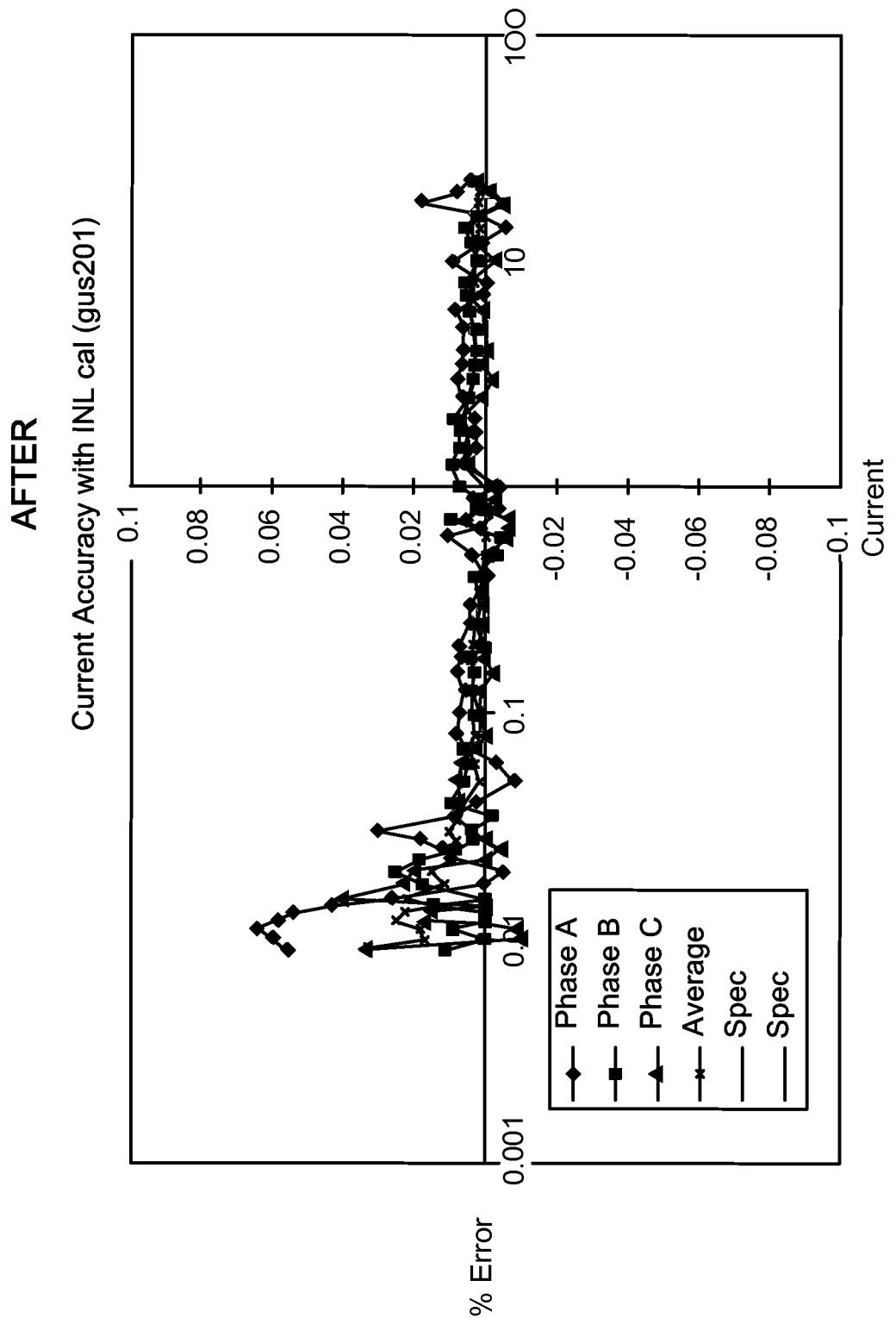
FIG. 6 depicts current accuracy of an exemplary electric power meter after calibration for integral non-linearities according to the disclosed embodiments.
Figure 7:
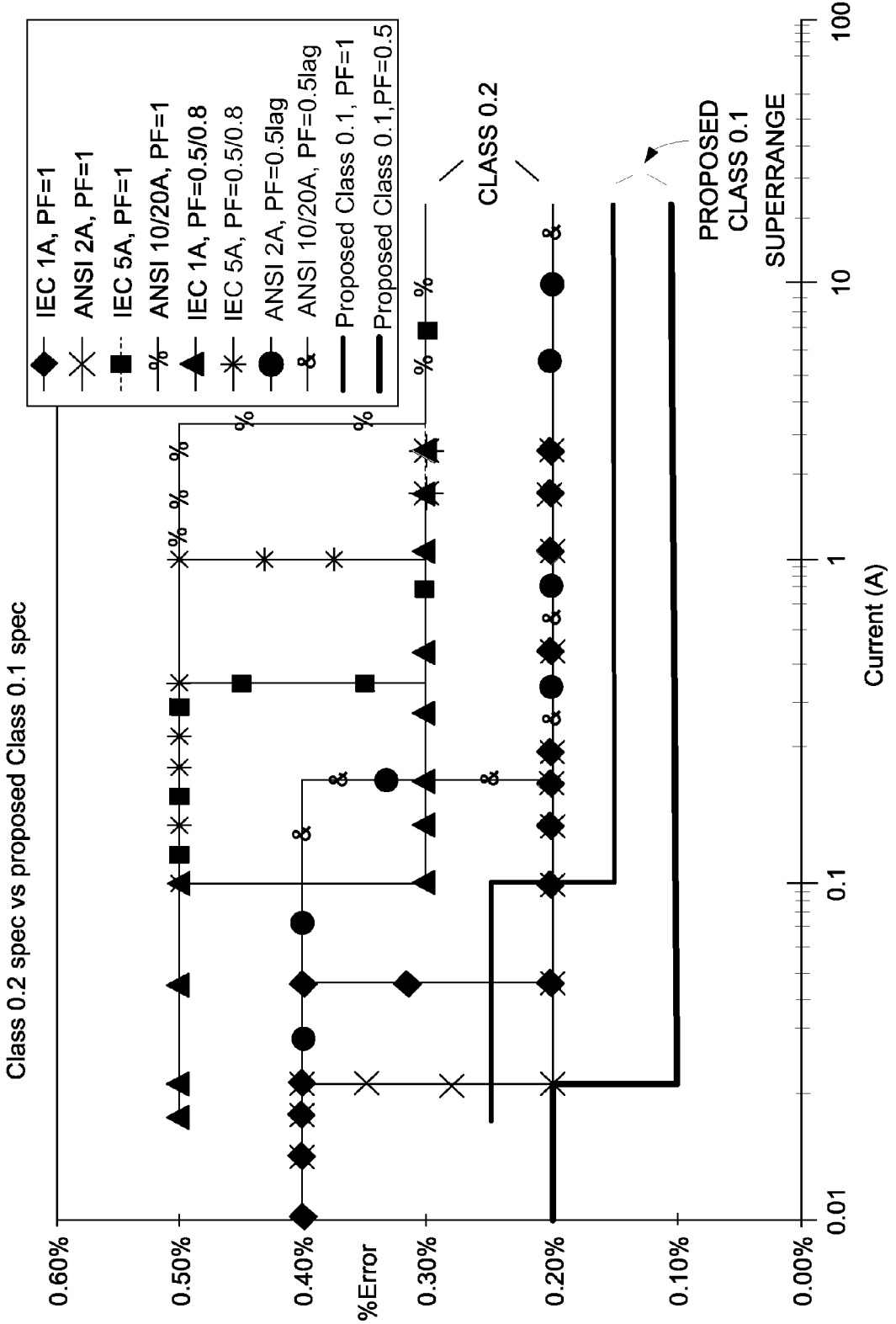
FIG. 7 depicts a comparison of electric power meter accuracy specifications.

FIG. 4 shows typical repeatability of integral non-linearity calibration for a current gain channel with a measurement range of 10 mA to 700 mA. As can be seen by comparing current accuracy before calibration for integral non-linearities, as shown in FIG. 5, with current accuracy after such calibration, as shown in FIG. 6, accuracy is substantially improved. This permits a meter, calibrated as described herein, to meet a proposed more stringent "Class 0.1%" accuracy spec, with an accuracy range of 10 mA to 20 A which is half of the error over twice the current range of prior meters. A comparison of accuracy specifications is shown in FIG. 7.

Figure 8:
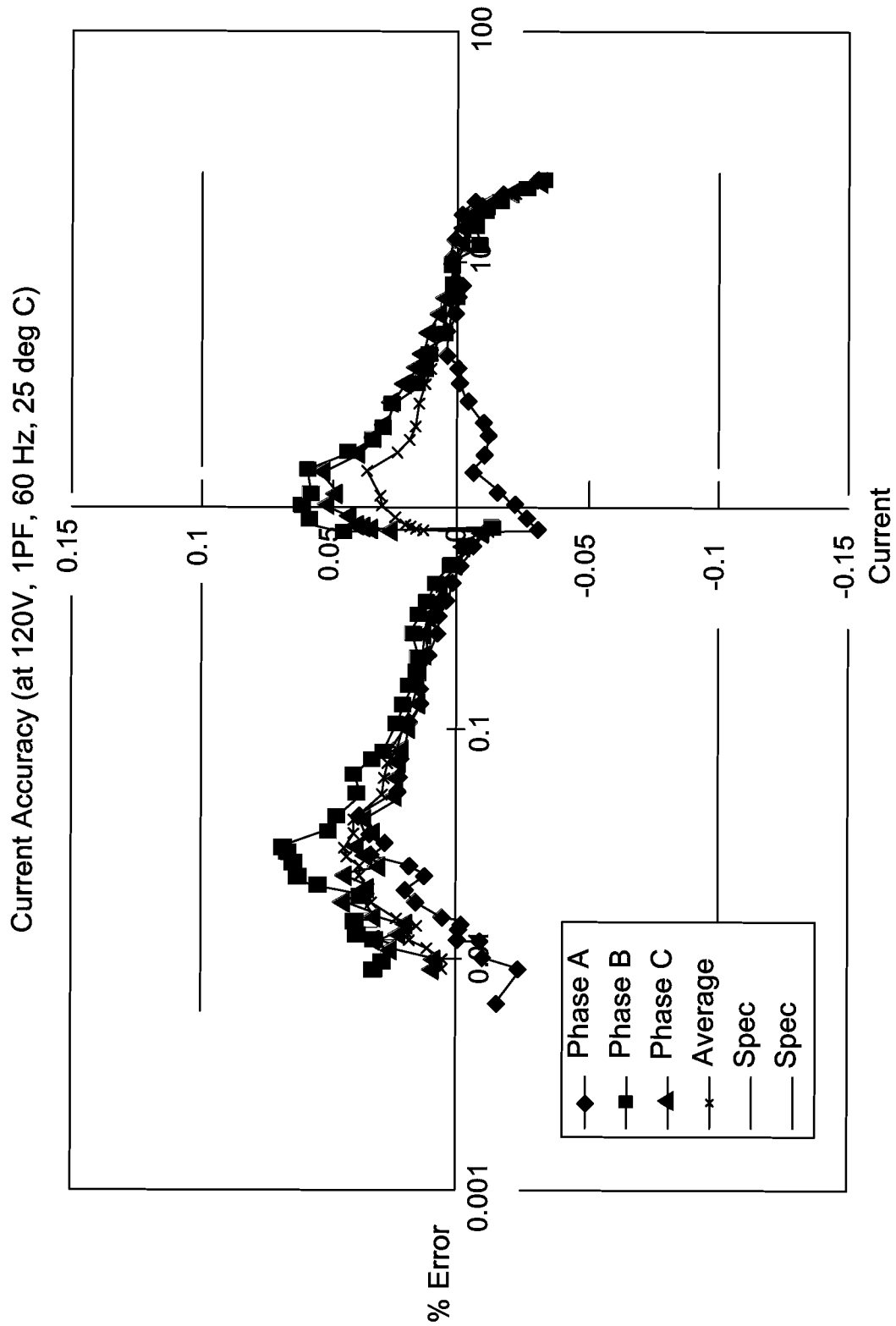
FIG. 8 depicts a typical current accuracy plot for an electrical power meter without integral non-linearity calibration.
Figure 9:
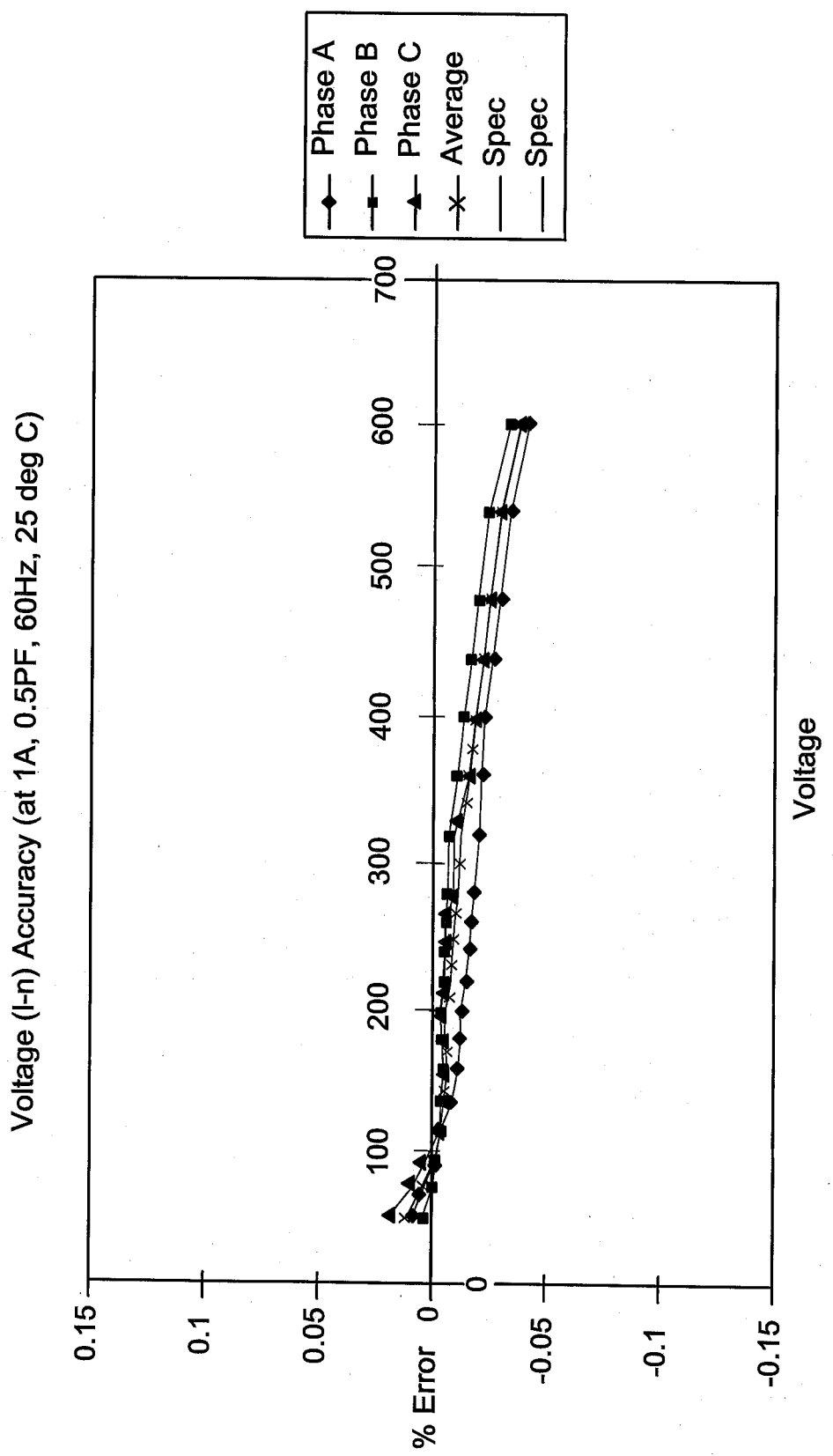
FIG. 9 depicts a typical voltage accuracy plot for an electrical power meter without integral non-linearity calibration

The disclosed embodiments achieve acceptable accuracy and production yield. Because the proposed 0.1% specification is for power, the error budget for both current and voltage is effectively reduced to ~0.05%. FIGS. 8 and 9 show typical current and voltage accuracy plots, respectively, for an electrical power meter without integral non-linearity calibration which show the non-linearities, especially of the current, easily exceed the ~0.05% error budget, even before any long-term drift is taken into account, demonstrating the need for integral non-linearity calibration.

The disclosed embodiments further calibrate for integral non-linearities across the entire measurement range as opposed to a multiple point calibration which may require numerous calibration points and be too time consuming to be acceptable. It is noted, however, that multipoint calibration may work for voltage calibration, as only 2 calibration points would be sufficient for correcting voltage non-linearities.

Figure 10:
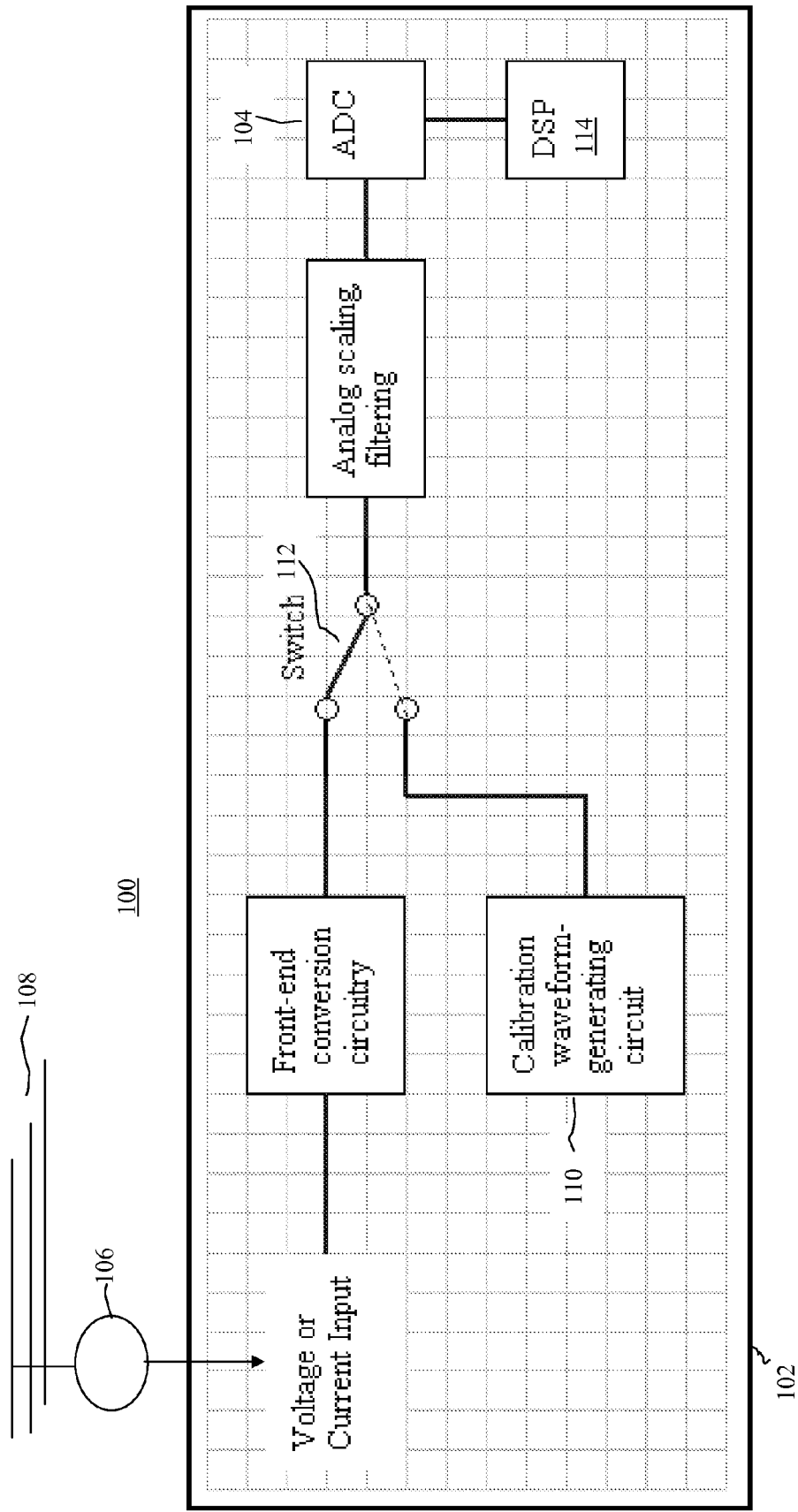
FIG. 10 depicts an intelligent electronic device according to one embodiment.

Referring to FIG. 10, there is shown an intelligent electronic device ("IED") 100 according to one embodiment, such as an electrical power meter, operable to monitor electrical energy. In one embodiment, the electrical power meter is the PowerLogic ION8650, manufactured by Schneider Electric USA, located in Palatine, Ill. The IED may include an enclosure 102, such as a housing, and an analog-to-digital converter 104 located within the enclosure and coupled with at least one sensor 106, such as a current and/or voltage sensor which is either internal or external to the enclosure. The at least one sensor 106 is operable to sense electrical energy, such as current or voltage, in one or more conductors 108 and output a corresponding electrical signal, e.g. and electrical sensor signal, indicative thereof. In one embodiment, the disclosed calibration mechanisms are used to compensate for integral non-linearities introduced in the measurement of current. The analog-to-digital converter 104 is operative to convert the electrical signal output by the at least one sensor 106 to at least one corresponding digital signal, e.g. a corresponding digital sensor signal. Herein, the phrase "coupled with" is defined to mean directly connected to or indirectly connected through one or more intermediate components. Such intermediate components may include both hardware and software based components. In one embodiment, the analog-to-digital converter is the TI ADS8365, manufactured by Texas Instruments Inc., located in Dallas, Tex., which features a unipolar voltage input range of 4.75 to 5.25 V, a parallel interface, and 6 16-bit channels. It will be appreciated that other suitable analog-to-digital converters may also be used.

The IED 100 also includes a waveform generator 110, also referred to as a calibration waveform generator 110, described in more detail below, located within the enclosure 102 and operative to generate a waveform, the analog-to-digital converter being further coupled with the waveform generator 110 to receive input therefrom, such as in a switchable 112 manner, e.g. via switch 112. Alternatively, the waveform generator may be coupled with the analog-to-digital converter 104 without using a switch, such as by adding the output of the waveform generator 110 to the output of the at least one sensor 106. It will be appreciated that the analog-to-digital converter 104 and the waveform generator 110 may be implemented on the same circuit board or on an arrangement of multiple interconnected circuit boards which make up at least a portion of the IED's 100 circuitry, having the analog-to digital converter 104 and waveform generator 110 disposed thereon, regardless of whether the IED 100 features an enclosure. In one embodiment, the waveform generator is implemented on the same circuit board as the analog-to-digital converter. The analog-to-digital converter 104 is further operative to convert the waveform, output by the waveform generator 110, to at least one corresponding digital signal representative thereof, e.g. to a corresponding digital calibration signal.

Figure 11:
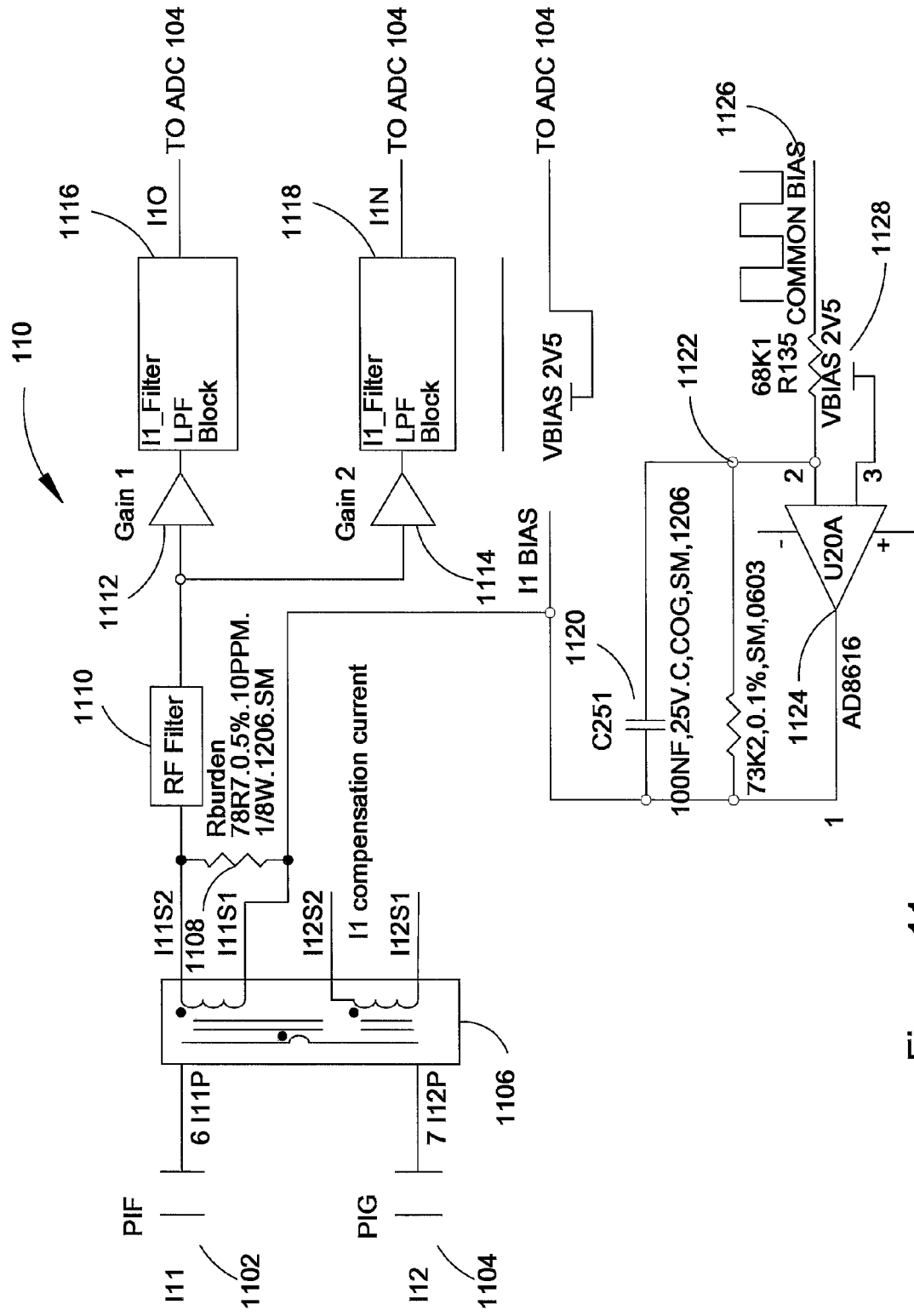
FIG. 11 depicts a schematic diagram of an exemplary RC decay circuit for use with the intelligent electronic device of FIG. 10.

In one embodiment, as shown in the schematic circuit diagram of FIG. 11, the waveform generator 110 includes a resistance-capacitance ("RC") decay circuit and generates an RC decay waveform. The RC decay circuit includes an Analog Devices AD8616 op-amp 1124, which is driven by an Analog Devices AD5308 digital-to-analog converter (not shown), both manufactured by Analog Devices, Inc., located in Norwood, Mass., at the "COMMON_BIAS" input 1126. The time-constant of the RC decay waveform is determined by a 73.2 kΩ thin-film resistor 1120 and a 100 nF negative-positive-zero capacitor 1122. A 68.11Ω thin-film resistor 1128 on the op-amp input realizes a gain on the op-amp, so that the magnitude of the RC decay waveform can be made to span the entire current measurement range. The rest of the circuit shown in this Figure is part of the meter's measurement circuitry, including the current terminals 1102 and 1104, the current transformer 1106, burden resistor 1108, RF filter 1110, gain circuits 1112 and 1114, and low-pass filters 1116 and 1118, is implementation-dependent and is provided to demonstrate one implementation of the waveform generator 110 therewith.

It will be appreciated that other waveform generators 110 may also be used which are capable of generating a waveform characterized by a magnitude which substantially changes over time substantially across a specified accuracy range of the intelligent electronic device 100, such as generators which generate sine wave, ramp or saw tooth waveforms, the construction of which will be known to those skilled in the art. In one embodiment, the waveform generator 110 is further operative to generate a plurality of waveforms spanning a measurement range of the intelligent electronic device 100. In one embodiment, the waveform includes sufficient cycles to correct for distortions smaller than one least significant bit of the analog-to-digital converter. An exemplary computation of how many cycles are sufficient is provided below.

Referring back to FIG. 10, the IED 100 further includes a processor 114 located within the enclosure 102 and coupled with the analog-to-digital converter 104 and the waveform generator 110 and operative to cause the analog-to-digital converter 104 to convert the waveform to at least one corresponding digital signal, analyze the at least one digital signal to identify at least one non-linear characteristic, such as an integral non-linearity, therein, and, based thereon, generate compensation data, such as calibration parameters, operable to cause the processor 114 to compensate for the identified non-linear characteristic in the conversion of the electrical signal from the at least one sensor 106 to the at least one corresponding digital signal during regular operation of the intelligent electronic device 100, e.g., electric power meter. In one embodiment, the processor 114 is a TI TMS320C6711 digital signal processor ("DSP"), manufactured by Texas Instruments, Inc., located in Dallas, Tex., featuring fast single-precision and double-precision floating-point instructions, and an enhanced direct-memory-access controller, making it suitable for interfacing with the analog-to-digital converter 104 and for power- and power-quality-related calculations. It will be appreciated that the disclosed processor 114 may be implemented via a combination of hardware and software which may include combinations of one or more discrete hardware and/or software processing components, including single and multi-core processors, multiple processors, field programmable gate arrays, or other devices now available or later developed, and all are contemplated herein. It will further be appreciated that the intelligent electronic device 100, e.g. electric power meter, may include additional components not shown or described which relate to the device's 100 ability to measure and report electrical energy consumption or perform other functions such as power quality assessment, communications, etc. The processor 114 may be further operative, as will be described in detail below, to compensate, based on the compensation data, for the identified non-linear characteristic in the conversion of the electrical signal from the at least one sensor 106 to the at least one corresponding digital signal, such as during normal operation of the intelligent electronic device 100, e.g., electric power meter, the at least one non-linear characteristic being substantially accounted for, i.e., removed therefrom or otherwise mitigated or reduced.

In one embodiment, the processor is further operative to calculate distortions in the at least one digital signal corresponding to the waveform, and for a set of simulated sine waves each having a different magnitude within a defined range, apply the calculated distortion to each of the simulated sine waves, compute a Root Mean Square of the distorted simulated sine wave, and compute one or more correction factors based thereon for subsequent application by the processor 114 to the digital signals resulting from the conversion of the electrical signal from the at least one sensor by the analog-to-digital converter 104, as is described in more detail below. The processor 114 may calculate the distortions by using a best fit curve estimation of the waveform, such as by using an estimation which is based on a least squares fit.

Further, the processor 114 may be operative to compute the correction factor(s) by application of the calculated distortion to a simulated sinusoidal waveform "A", calculate a dot-product, e.g., an algebraic operation that takes two equal-length sequences of numbers and returns a single number obtained by multiplying corresponding entries and adding up those products, of the distorted simulated sinusoidal waveform "B" with an undistorted simulated sinusoidal waveform "C", the correction factor being a function of the undistorted dot-product A•C and the distorted dot-product B•C. For example, processor may calculate a kilowatt value that results from the distorted simulated sinusoidal waveform and an undistorted simulated sinusoidal waveform at unity power factor, the correction factor being the ratio of the kilowatt value for the undistorted simulated sinusoidal waveform to the kilowatt value for the distorted simulated sinusoidal waveform. The conversion of the calibration waveform and the computation of the at least one correction factor may further include calculating an average of one or more cycles of the calibration waveform over a duration of time sufficient such that the standard deviation of each sample in the averaged waveform is less than a scaled RMS of a simulated sinusoidal waveform that would contain that sample, multiplied by a scaled targeted error allowance.

Figure 12A:
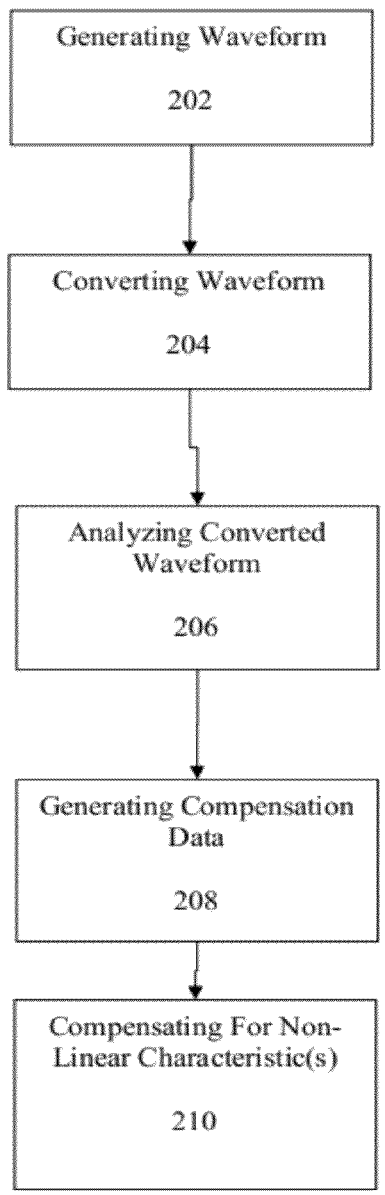
FIGS. 12A and 12B depict a flowchart showing exemplary operation of the intelligent electronic device of FIG. 10 according to one embodiment.
Figure 12B:
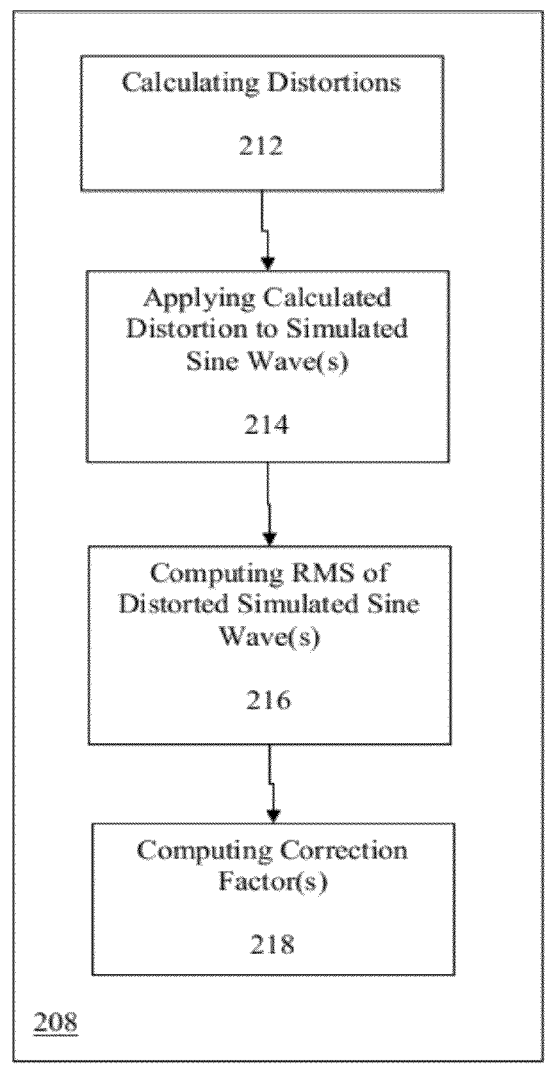

Referring to FIGS. 12A and 12B, there is shown a flowchart depicting operation of the disclosed embodiments for calibrating an intelligent electronic device operable to monitor electrical energy. These operations may be implemented as computer executable program code stored in a memory and executable by a processor 114 to achieve the stated functions. In one embodiment, these operations are implemented as functions in the C programming language and are executable by the processor 114, e.g., the TI TMS320C6711 DSP, described above. As described above, the intelligent electronic device includes an enclosure and an analog-to-digital converter located within the enclosure and coupled with at least one sensor, such as an internal or external voltage and/or current sensor. The at least one sensor being operable to sense electrical energy in one or more conductors and output a corresponding electrical signal indicative thereof, the analog-to-digital converter being operative to convert the electrical signal output by the at least one sensor to at least one corresponding digital signal.

The operation includes: generating, within the enclosure or on the same one or more circuit boards which make up the IED and also contain the analog-to-digital converter, such as with a resistance-capacitance decay circuit, a calibration waveform (block 202), such as a resistance-capacitance decay, sine wave, ramp, or saw tooth waveform or other waveform which comprises a magnitude which substantially changes over time substantially across a specified accuracy range of the intelligent electronic device. In one embodiment, the generating may further include generating a plurality of calibration waveforms spanning a measurement range of the intelligent electronic device. In one embodiment, the calibration waveform comprises sufficient cycles to correct for distortions smaller than one least significant bit of the analog-to-digital converter.

The operation further includes: converting, by the analog-to-digital converter, the calibration waveform to at least one corresponding digital signal (block 204); and analyzing the at least one digital signal to identify at least one non-linear characteristic therein (block 206), and, based thereon, generating compensation data to be used by the processor 114 to compensate for the identified non-linear characteristic in the conversion of the electrical signal from the at least one sensor to the at least one corresponding digital signal (block 208). The operation may further include compensating, such as by the processor 114 during normal operation of the intelligent electronic device 100, e.g., electric power meter, based on the compensation data, for the identified non-linear characteristic in the conversion of the electrical signal from the at least one sensor to the at least one corresponding digital signal, the at least one non-linear characteristic being substantially removed therefrom (block 210).

In one embodiment, the converting further includes calculating an average of one or more cycles of the calibration waveform over a duration of time sufficient such that the standard deviation of each sample in the averaged waveform is less than a scaled RMS of a simulated sinusoidal waveform that would contain that sample, multiplied by a scaled targeted error allowance.

In one embodiment, as shown in FIG. 12B, the generating of compensation data further comprises calculating distortions in the at least one digital signal corresponding to the calibration waveform (block 212), such as by using best fit curve estimation, e.g., a least squares fit, and for a set of simulated sine waves each having a different magnitude within a defined range, applying the calculated distortion to each of the simulated sine waves (block 214), computing a Root Mean Square of the distorted simulated sine wave (block 216), and computing one or more correction factors based thereon for subsequent application by the processor 114 to the at least one corresponding digital signal produced by the analog-to-digital converter 104 as it converts the electrical signal from the at least one sensor thereto (block 218). In one embodiment, computing of the correction factor(s) further includes applying the calculated distortion to a simulated sinusoidal waveform, calculating a kilowatt value that results from the distorted simulated sinusoidal waveform and an undistorted simulated sinusoidal waveform at unity power factor, the correction factor being the ratio of the kilowatt value for the undistorted simulated sinusoidal waveform to the kilowatt value for the distorted simulated sinusoidal waveform.

In one implementation, the non-linearity calibration process is used in conjunction with one or more other independent calibrations steps which correct for absolute magnitude.

It will be appreciated that there may be other ways to implement the disclosed embodiments available now or later developed and that all such ways are contemplated herein.

Figure 13:
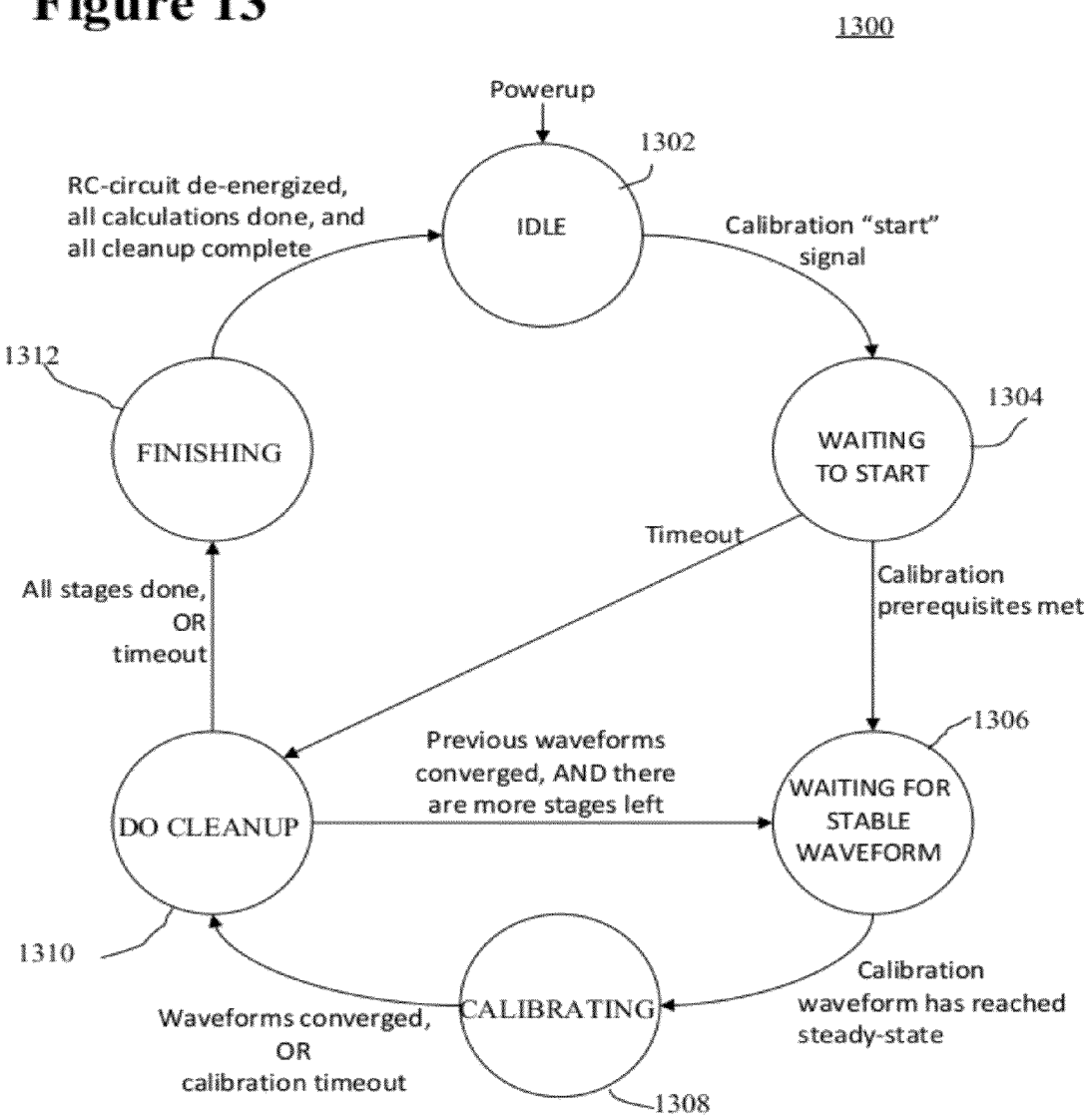
FIG. 13 depicts a block diagram of a calibration state machine according to one embodiment.

The INL calibration state machine 1300 is shown in FIG. 13, which presents a basic overview of the entire calibration process. This state machine executes once per high-speed interval, i.e., every 512 samples. The function of each state is as follows:

ICAL_STATE_IDLE 1302: The meter is not calibrating, i.e., regular meter operation.

ICAL_STATE_WAITING_TO_START 1304: Waiting for all calibration prerequisites to be met. These prerequisites include:
  DCO (DC offset compensation) to settle,
  RMS readings to be below the noise threshold for the channels being calibrated, and
  the power quality (PQ) task to come to a clean stop (to free up processor usage for the calibration calculations, and reduce interrupt jitter).

ICAL_STATE_WAITING_FOR_STABLE_WAVEFORM 1306: The calibration-waveform is being generated, but the RC-circuit has not yet reached steady-state. Presently the system waits for 14 high-speed intervals in this state, which is enough time for 5V to decay to 1/100'th of an ADC count with the disclosed RC circuit.

ICAL_STATE_CALIBRATING 1308: The calibration-waveform has reached steady-state conditions, and waveforms are being accumulated. Note that that multiple fail-safes are in place to avoid erroneous calibrations. For example, if an external signal is applied mid-calibration, then the waveform will fail to converge and calibration will fail—or even if somehow the waveform does converge, then the calculated RC time constant will be out of bounds, and the calibration will fail. See below regarding waveform accumulation and further describing the calibrating state.

ICAL_STATE_DO_CLEANUP 1310: This state checks calibration results, and if necessary advances to the next calibration stage, or performs cleanup of all changes invoked by this calibration attempt. See below regarding Calibration Cleanup and Processing further describing the processing done in the cleanup state.

ICAL_STATE_FINISHING 1312: Waits for RC-circuit to de-energize, frequency to re-lock, and background calculations to finish before going back to the IDLE state.

In the described implementation, the above states are enumerated in a C computer program enumerated type. Further related functions include a function to operate the state machine, called every 512 samples.

Further, the computer program code which executes on the digital signal processor (DSP) of the meter is modified to add support for generating the INL calibration waveforms using the appropriate hardware, i.e., the RC-decay circuit coupled therewith.

A new source file of computer program code of the present implementation contains the interface for waveform generation and accumulation.

The INL calibration waveform is generated by a digital-to-analog converter (DAC) output with an active low-pass RC filter on its output (see FIG. 11, described above). Hence toggling the DAC output between 2 values will generate 2 exponential decay curves, one rising, and one falling, as shown in FIG. 1 which shows an ADC sample of the RC waveform vs sample #. Note that the waveform wraps, and that the clipping/saturation is intentional so that the calibration waveform covers the full range. Because the timing of the DAC transitions may be critical (ideally the timing jitter should be less than one sample period), during INL calibration the DAC will be written to in the context of the computer program's "DMA complete" interrupt service routine, which is called every 128 samples. (During normal meter operation, the DAC channel will be powered off and will not be written to.)

In order to provide low timing jitter, it was also found that:
(a) The sampling frequency needed to be constant, rather than following the voltage input frequency, and
(b) The power-quality ("PQ") task needed to be halted, due to the irregular load it placed on the processor;
both of which may be controlled via appropriate computer program code modules executed by the DSP.

In the described implementation, a new function is implemented, which is called by the "DMA complete" interrupt service routine ("ISR") to generate the DAC transitions at the appropriate times to generate the calibration waveform.

Figure 14:
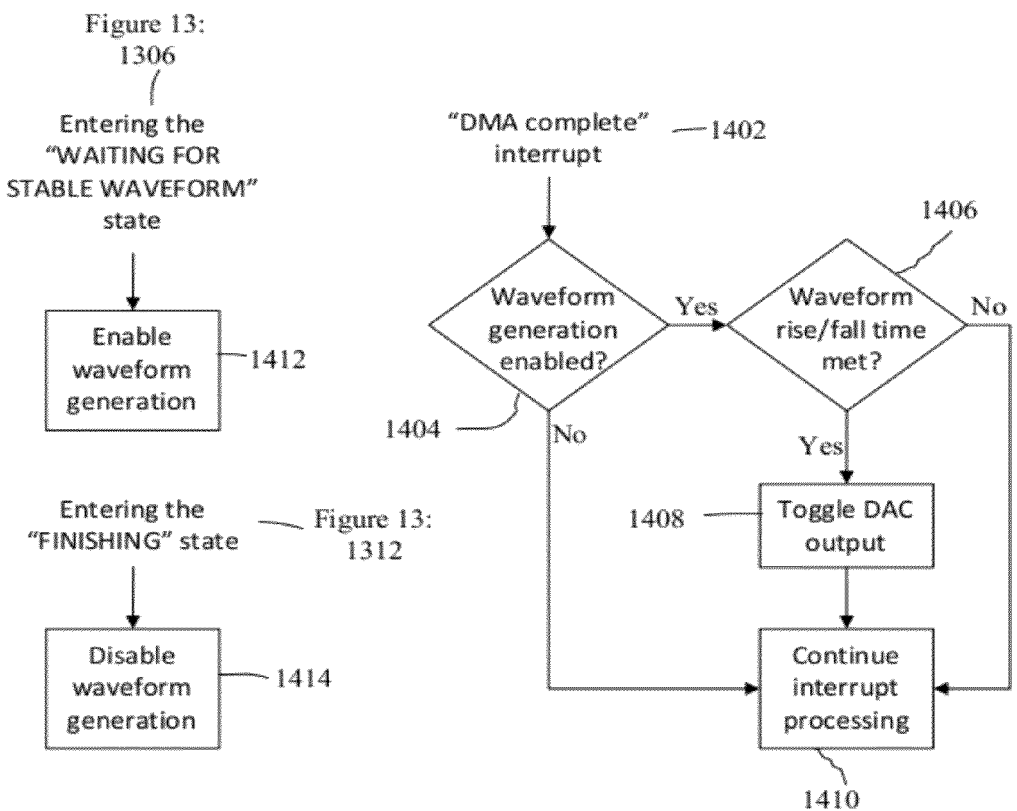
FIG. 14 depicts a flowchart of the computer software program for generating the calibration waveform according to one embodiment.

A flowchart of the software program code for generating the calibration waveform is depicted in FIG. 14. As shown in FIG. 14:
1. "DMA complete interrupt" 1402—This interrupt occurs when 128 samples have been read from each ADC.
2. "Waveform generation enabled?" 1404—Checks if the calibration waveform has been enabled. Waveform generation is enabled 1412 when the calibration state machine enters the "WAITING FOR STABLE WAVEFORM" state, and is disabled 1414 when the state machine enters the "FINISHING" state.
3. "Waveform rise/fall time met?" 1406—Checks if the calibration waveform rise/fall time has been met. The disclosed implementation has a rise/fall time of approximately 33 ms (2048 samples).
4. "Toggle DAC output" 1408—Sets the COMMON_BIAS DAC output to one of 2 values which control the amplitude of the calibration waveform.
5. "Continue interrupt processing" 1410—Continues interrupt processing (unrelated to calibration).

Because it is desirable to correct for waveform distortions smaller than 1 ADC LSB, the calibration waveform must be averaged over many periods to provide small enough sample resolution, and to eliminate the effects of random noise and DAC timing jitter. This accumulation continues until the waveform has "converged" (see below). In the described implementation, waveform accumulation takes place in the context of the high-speed (half-cycle) task on the DSP, while in the "Calibrating" state. In the computer program code of the described implementation, a function is implemented which performs the accumulation and checks for convergence (section below).

Figure 15:
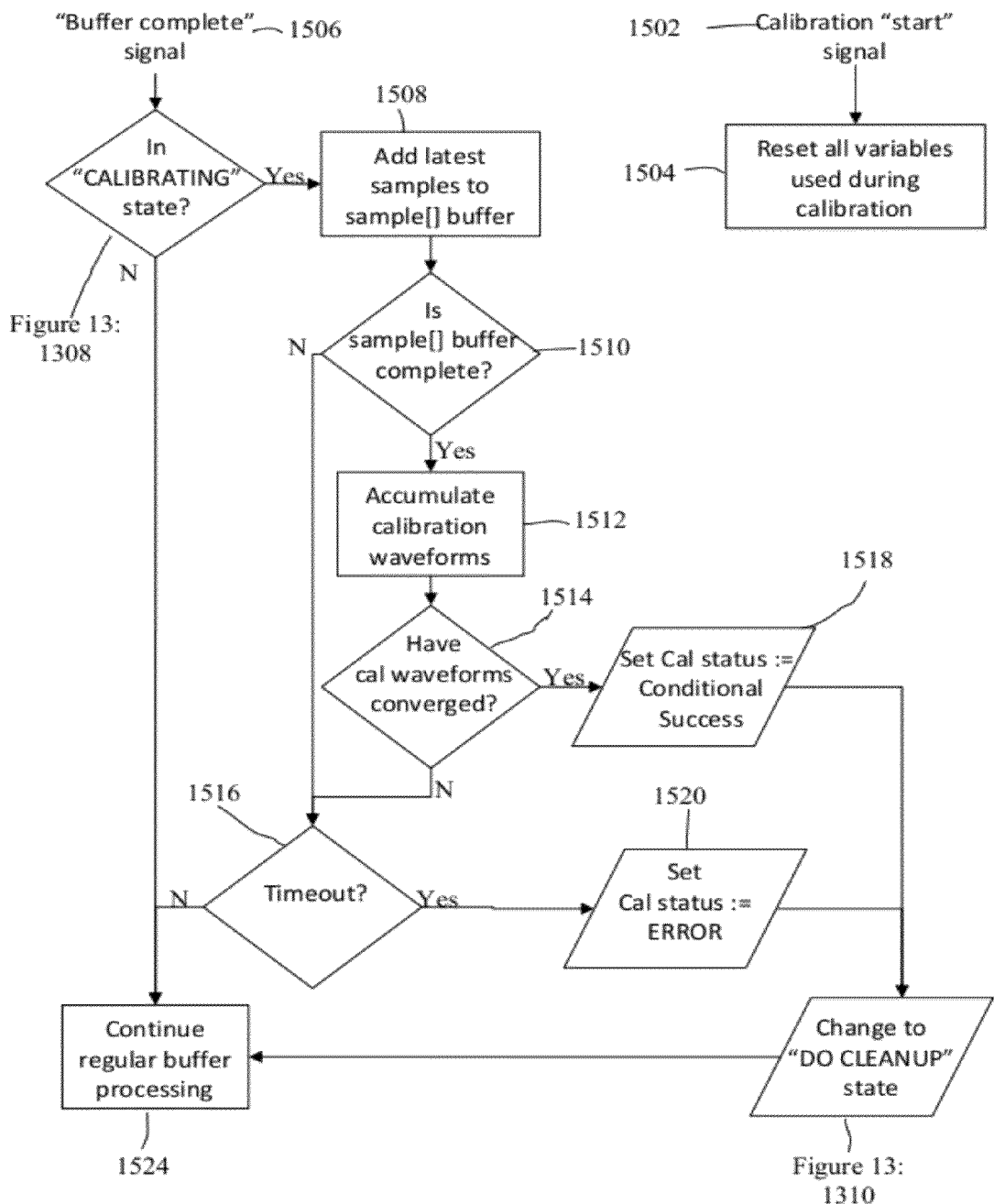
FIG. 15 depicts a flowchart of the computer software program for accumulating the calibration waveform according to one embodiment.

A flowchart of the software program code for accumulating the calibration waveform is depicted in FIG. 15. As shown in FIG. 15:
1. "Calibration start signal" 1502—This signals the start of an INL calibration cycle. The measurement channels to be calibrated are also specified at this time.
2. "Reset all variables used during calibration" 1504—This is done at the start of an INL calibration cycle.
3. "Buffer complete signal" 1506—This signal is generated when a 512-sample buffer has been filled with ADC samples.
4. "Add latest samples to sample[ ] buffer" 1508—Appends the latest samples from the previous step into a local circular sample[ ] array.
5. "Is sample[ ] buffer complete?" 1510—The sample[ ] buffer is complete when one full period of the calibration waveform (i.e., 4096 samples) has been captured.
6. "Accumulate calibration waveforms" 1512—Executes the following pseudo-code for each measurement channel being calibrated:
   For 'i' from 1 to 4096:
      sum[i]+=sample[i]
      ssq[i]+=sample[i]*sample[i]
      where "sum" and "ssq" are arrays that accumulate the sum and sum-of-squares for each sample in the calibration waveform, and "+=" is the "increment by" operator.
7. "Have cal waveforms converged" 1514—Checks if the calibration waveforms have been accumulated for long-enough to achieve the desired accuracy. This is described below with respect to the calibration convergence criteria. An unbiased variance estimator may be used to calculate $\sigma\{sample\}$, i.e., $\sigma^2\{sample[i]\}=1/(n-1)*(ssq[i]-sum[i]*sum[i]/n)$, where n is the number of full periods of the calibration waveform that have been accumulated.
8. "Timeout?" 1516—Checks if calibration is taking too long. The timeout value of the disclosed implementation is set to 100 seconds (approximately 10× the expected calibration time).
9. "Set Cal status:=Conditional success" 1518—Sets a calibration status flag to conditional success, which is checked for later.
10. "Set Cal status:=ERROR" 1520—Sets a calibration status flag to the appropriate error.
11. "Change to 'DO CLEANUP' state" 1522—Changes the state of the calibration state machine to the "DO CLEANUP" state.
12. "Continue regular buffer processing" 1524—Continues regular buffer processing (unrelated to calibration).

Figure 16:
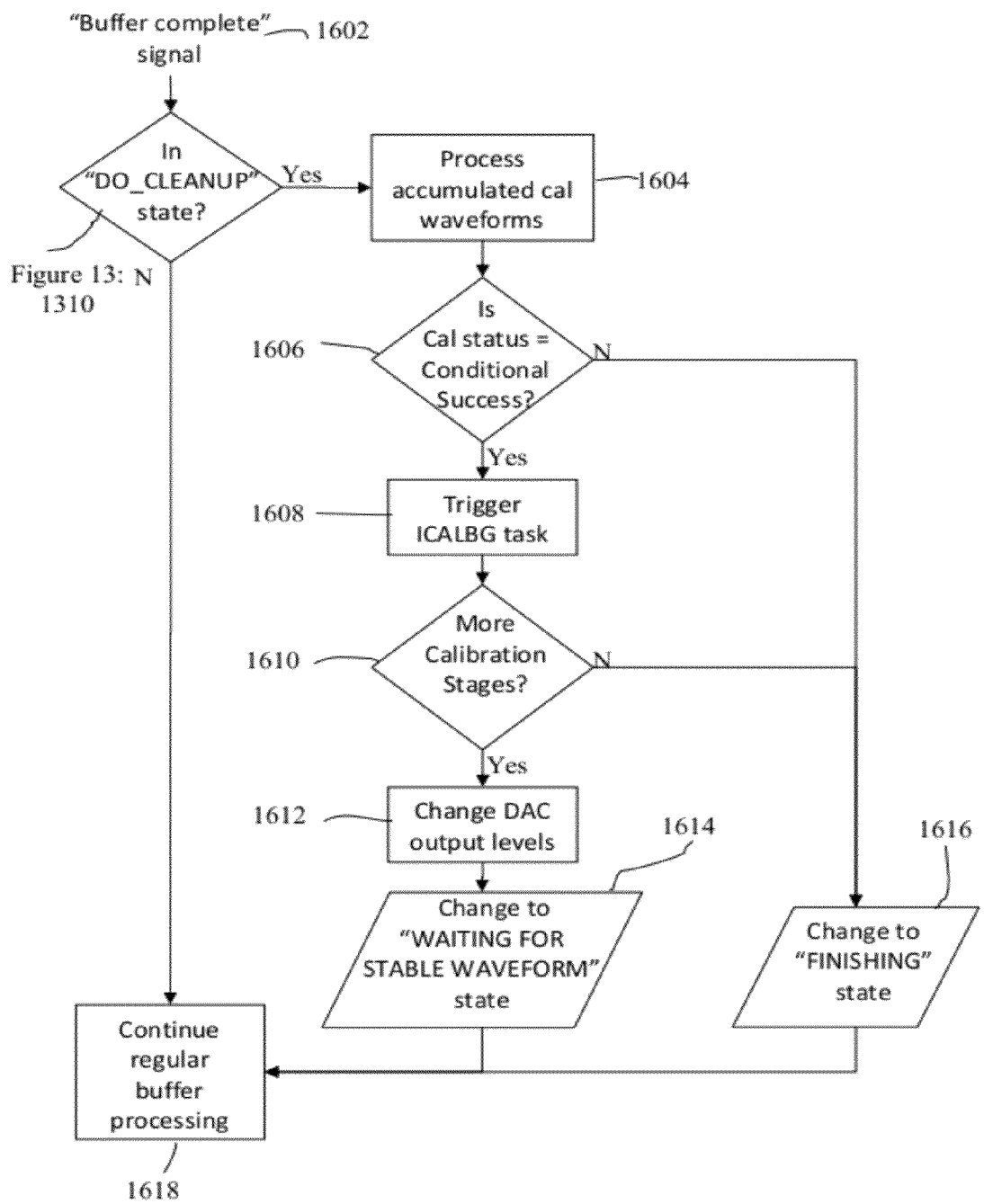
FIG. 16 depicts a flowchart of the computer software program for processing the calibration waveforms according to one embodiment.

A flowchart of the software program code for processing the calibration waveforms in the "DO CLEANUP" state 122 is depicted in FIG. 16. As shown in FIG. 16:
1. "Buffer complete signal" 1602—This signal is generated when a 512-sample buffer has been filled with ADC samples.
2. "Process accumulated cal waveforms" 1604—Calculates the average calibration waveform for each channel being calibrated, i.e., the average calibration waveform is calSample[i]:=sum[i]/n, where n is the number of full periods of the calibration waveform that were accumulated. This array is made available for diagnostics, and is used in later processing.
3. "Is Cal status=Conditional Success?" 1606—Checks whether the output of the CALIBRATING state was a conditional success.
4. "Trigger ICALBG task" 1608—Queues a job for the "INL calibration background task" (see FIG. 17—ICALBG task), passing it the calSample[ ] arrays calculated above.
5. "More calibration stages?" 1610—Checks whether more calibration stages are required to calibrate this measurement channel.
6. "Change DAC output levels" 1612—Changes the DAC output levels used in generating the calibration waveform, thereby changing the amplitude of the calibration waveform.

7. "Change to 'WAITING FOR STABLE WAVEFORM' state" 1614—Changes the state of the calibration state machine to the "WAITING FOR STABLE WAVEFORM" state.
8. "Change to 'FINISHING' state" 1616—Changes the state of the calibration state machine to the "FINISHING" state.
9. "Continue regular buffer processing" 1618—Continues regular buffer processing (unrelated to calibration).

Figure 17:
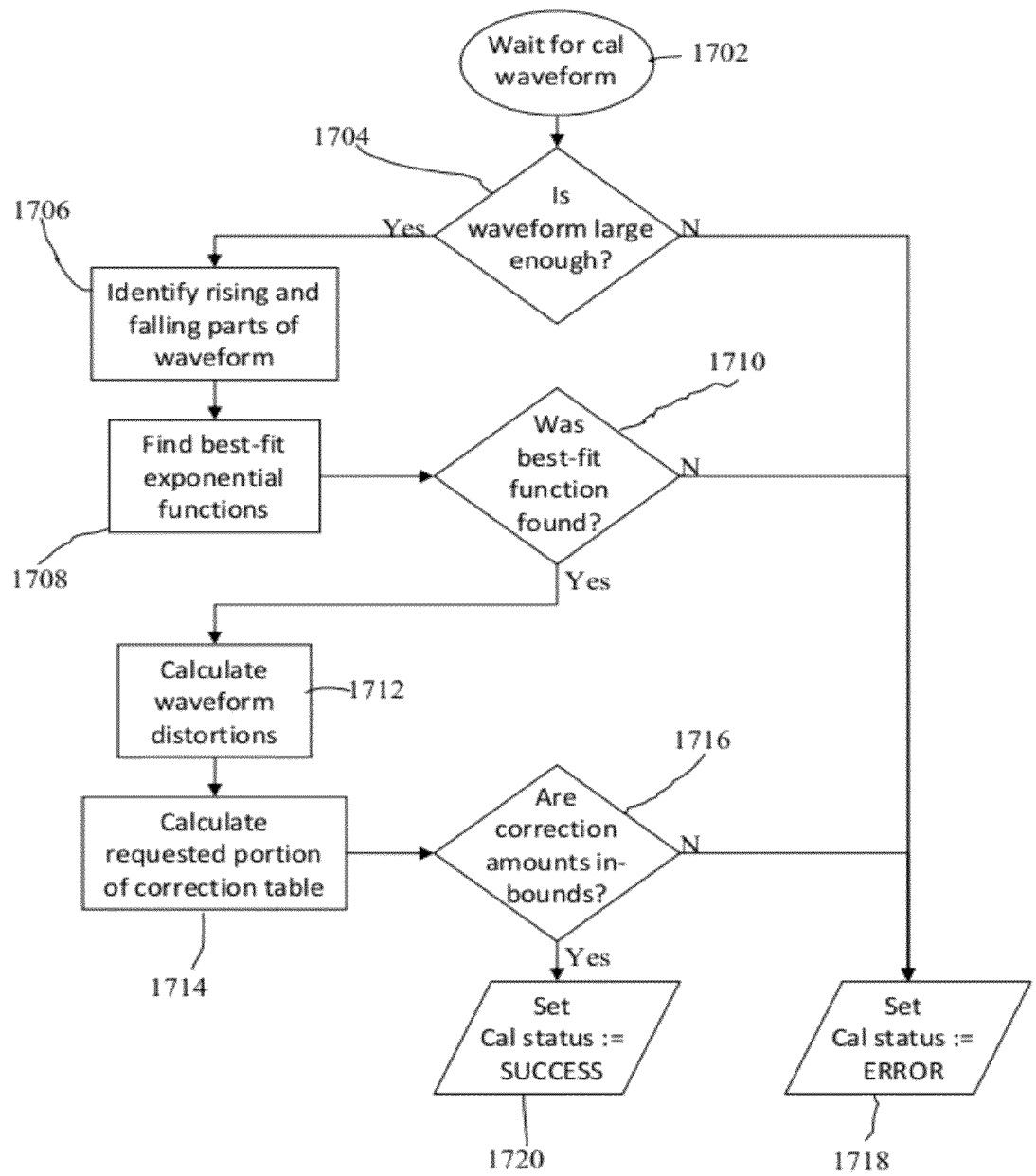
FIG. 17 depicts a flowchart of the computer software program for generating the calibration correction table according to one embodiment.

After waveforms have been accumulated, distortions in the waveforms need to be analyzed to generate correction tables. Because calculation of a correction table is processor-intensive, these calculations may be done in a new background task on the DSP (at a lower priority than everything else except the built-in "idle" task). This "ICALBG task" (INL calibration background task) processes a calibration waveform to generate a correction table (or a portion thereof), and a calibration status flag for that waveform, as shown in FIG. 17—ICALBG task. Note that a multi-stage calibration has multiple calibration waveforms per measurement channel, each corresponding to a portion of the correction table for that measurement channel.

Description of FIG. 17—ICALBG task:
1. "Wait for cal waveform" 1702—Waits until the ICALBG task has received a calibration waveform to process.
2. "Is waveform large enough" 1704—Checks that the amplitude of the calibration waveform is sufficient to accurately calculate the requested portion of the correction table. In order for the calibration waveform to be considered "large enough", its positive and negative peaks must exceed the peaks of the sine wave corresponding to the largest requested point of the correction table to fill.
3. "Identify rising and falling parts of the waveform" 1706—This is described below.
4. "Find best-fit exponential functions" 1708—Finds the best-fit exponential curves for the rising and falling calibration waveforms, as described below.
5. "Was best-fit function found?" 1710—Checks whether there was an error finding the best-fit exponential function. That is, it is considered an error if there is no solution for 'q' found between the limits of 'q' that are expected based on component tolerances of the resistor and capacitor used in the RC-decay waveform generating circuit.
6. "Calculate waveform distortions" 1712—Calculates the distortions in the sampled waveform, based on the difference between the actual sample value and the best-fit exponential curve, as described below.
7. "Calculate requested portion of correction table" 1714—Applies the distortions to simulated sine waves to fill in the requested portion of the correction table, as described below.
8. "Are correction amounts in bounds?" 1716—Checks whether the values in the correction table are in-bounds. In one implementation, bounds of unity +/−3.2767% are imposed for each correction factor, related to the number of bits used to store the correction factor.
9. "Set Cal status:=ERROR" 1718—Sets a calibration status flag to the appropriate error.
10. "Set Cal status:=SUCCESS" 1720—Sets a calibrating status flag to indicate successful completion.

In the described implementation, the source computer program code for these background calculations is contained in a separate source code file.

This file contains a function which identifies rising and falling parts of the calibration waveform. The start of the rising part of the waveform is at the first sample index 'i' (with wraparound considered) that satisfies calSample[i+1]−calSample[i]>5, and calSample[i+2]−calSample[i+1]>5. Similarly, the start of the falling part of the waveform is at the first sample index 'i' (with wraparound considered) that satisfies calSample[i+1]−calSample[i]<−5, and calSample[i+2]−calSample[i+1]<−5.

To analyze waveform distortions, the undistorted waveform should be determined. To do this, the best-fit pair of exponential functions for the rising and falling portions of the calibration waveform is found.

There may be no readily-available equation or method for finding a best-fit generic exponential curve for a set of data points; existing methods assume that the asymptote is equal to zero, and furthermore, do a best-fit on the logarithm of the y-values, rather than the actual y-values, which is what is needed here. However, basic principles of least-squares best-fit analysis may be used to solve the resulting equations numerically for the case where the x values are equally spaced (with respect to the disclosed implementation, time between samples is a constant). In one implementation, derivation of the best fit exponential curve is as follows:

The functions:

$$f_r(i) = y_r + m_r q^i, i = 0, 1, 2, \ldots, N_r - 1$$

$$f_f(j) = y_f + m_f q^j, j = 0, 1, 2, \ldots, N_f - 1$$

describe points on two exponential curves that share the same base q. Conceptually, these can be thought of as voltage samples on "rising" and "falling" RC decay curves that share the same RC time constant $\tau = RC$, where the points are sampled at a constant rate of $t_s$ seconds between samples, and:

i,j=sample index for the rising and falling decay curves, respectively.

$N_r$, $N_f$=number of sampled points in the rising and falling decay curves, respectively.

$$q = e^{-t_s/\tau}$$

$y_r$=asymptotic voltage that the rising RC decay curve approaches as time approaches infinity.

$y_f$=asymptotic voltage that the falling RC decay curve approaches as time approaches infinity.

$m_r$=scale factor dependent on the initial condition $f_r(0)$ of the rising RC decay curve.

$m_f$=scale factor dependent on the initial condition $f_f(0)$ of the falling RC decay curve.

Let $$Y_r(i), i = 0, 1, 2, \ldots, N_r - 1$$

$$Y_f(i), i = 0, 1, 2, \ldots, N_f - 1$$

be actual measured sample values for rising and falling RC decay curves, respectively. Hence these sampled values include distortions introduced by measurement circuitry. Then it can be shown that the functions $f_r(i)$ and $f_f(j)$ which "best-fit" the sampled values (i.e., minimize total variance between the functions and the sample values) are given by the non-zero q which satisfies:

$$m_r \left[ \left( \frac{q}{q-1} \right) (q^{N_r - 1} - Q_{n,r})(N_r y_r) + \left( \frac{q^2}{q^2 - 1} \right) (q^{2N_r - 2} - Q_{n,r} Q_{p,r})(N_r m_r) - \right.$$

-continued $$\sum_{i=0}^{N_r-1} iq^i Y_r(i) + m_f \left( \left( \frac{q}{q-1} \right) (q^{N_f-1} - Q_{n,f})(N_f y_f) + \right.$$

$$\left. \left( \frac{q^2}{q^2-1} \right) (q^{2N_f-2} - Q_{n,f} Q_{p,f})(N_f m_f) - \sum_{i=0}^{N_f-1} iq^i Y_f(i) \right) = 0$$

where:

$$Q_{n,r} = \frac{1}{N_r} \left( \frac{q^{N_r}-1}{q-1} \right), \quad Q_{p,r} = \frac{q^{N_r}-1}{q+1},$$

$$Q_{n,f} = \frac{1}{N_f} \left( \frac{q^{N_f}-1}{q-1} \right), \quad Q_{p,f} = \frac{q^{N_f}-1}{q+1},$$

$$y_r = \frac{1}{N_r} \left( \frac{\sum_{i=0}^{N_r-1} Y_r(i) Q_{p,r} - \sum_{i=0}^{N_r-1} q^i Y_r(i)}{Q_{p,r} - Q_{n,r}} \right),$$

$$m_r = -\frac{1}{N_r} \left( \frac{\sum_{i=0}^{N_r-1} Y_r(i) Q_{n,r} - \sum_{i=0}^{N_r-1} q^i Y_r(i)}{Q_{n,r}(Q_{p,r} - Q_{n,r})} \right),$$

$$y_f = \frac{1}{N_f} \left( \frac{\sum_{i=0}^{N_f-1} Y_f(i) Q_{p,f} - \sum_{i=0}^{N_f-1} q^i Y_f(i)}{Q_{p,f} - Q_{n,f}} \right),$$

$$m_f = -\frac{1}{N_f} \left( \frac{\sum_{i=0}^{N_f-1} Y_f(i) Q_{n,f} - \sum_{i=0}^{N_f-1} q^i Y_f(i)}{Q_{n,f}(Q_{p,f} - Q_{n,f})} \right).$$

Note that only a portion of the rising and falling waveforms may be used to calculate the best-fit exponential curve since the large amounts of non-linearity at higher magnitudes (due primarily to filter and op-amp nonlinearity) yields poorer results. (See FIG. 2 showing INL vs sample value on I10.)

Also, in finding the correct best-fit exponential function, both the rising and falling portions of the waveform may be considered simultaneously; this is due to a hysteresis effect that causes the rising and falling parts of the calibration waveform to exhibit different INL's by the time they are sampled (again see FIG. 2 showing INL vs sample value on I10). Using only the rising/falling portion of the calibration waveform generally may lead to a poor estimate of the exponential function (i.e., this may not predict the measured accuracy curve well enough). To solve this problem, the best-fit pair of exponential functions (one rising, one falling) is found that share a common 'q' ('q' must be the same since it is based on the RC time constant of the calibration waveform). Refer to the derivation shown above.

The value of 'q' may be found numerically. The disclosed implementation uses Brent's method because it is fast and is guaranteed to converge. Brent's method is a root-finding algorithm which combines root bracketing, bisection and inverse quadratic interpolation. It will be appreciated that there may be other methods which may also be used.

In the described implementation, computer program functions to find the best-fit exponential curve are implemented and include a function to evaluate the derivative whose root 'q' is the best fit value needed above, and a function that is a robust numerical root-finder (in new source file), based on Brent's method (see http://en.wikipedia.org/wiki/Brent's_method), with modifications for numerical stability and speed of convergence.

Once the best-fit exponential curve has been calculated, the distortions in the sampled waveform can easily be calculated as $INL(y_{bestfit}(t)) = y_{sampled}(t) - y_{bestfit}(t)$. Shown in FIG. 2 is the distortion seen in a typical waveform. Note the following:
 (a) Blue (202)=INL from the rising part of the calibration waveform
 (b) Pink (204)=INL from the falling part of the calibration waveform
 (c) The center (bold) region (206) from −12288 to +12288 region of the graph was the part used to find the best-fit exponential curve.
 (d) The "spike" at ~14500 ADC counts is characteristic of rail-to-rail input op-amps. The disclosed process deliberately stops before the spike in the calculation of the best-fit exponential curve.
 (e) The discontinuities (e.g., at 0) are characteristic of the TI ADS8365 ADC's used in the implementation described herein.
 (f) The large INL at extreme sample values is suspected to be caused by the filters, or possibly the voltage-follower op-amp. (Equivalent analysis on the I1_BIAS signal confirms the ADC's are relatively flat across the ADC's entire range.)

In the described implementation, a computer program code functions is implemented which calculates an INL table, i.e., an array of points mapping $y_{bestfit}(t)$ to $INL(y_{bestfit}(t))$. Separate INL tables for the rising and falling portions of the calibration waveform are calculated.

Once rising and falling INL tables have been calculated, each point of the correction table is filled in. For a given correction table point with a given RMS=A/sqrt(2), the following steps are performed:
 1. Apply the INL from the INL tables to a simulated N-point sinusoidal current waveform (using linear interpolation between points of the INL table).
 2. Calculate the kW that would result using the above distorted current waveform and an undistorted voltage waveform, at unity power factor.
 3. Calculate the correction factor for this point as:

correctionFactor=kwOriginal/kwDistorted

Note that the above steps are conceptual steps; the actual implementation uses the optimization:

$$correctionFactor_{kW,kVAR} = \frac{1}{1 + \frac{2}{N*A} \sum_{\substack{c=point\ from \\ half-cosine\ wave}} (inl_{rising}(c) + inl_{falling}(c)) * c}$$

In the described implementation, the following computer program code functions are implemented:
 A function which fills a single correction table; and
 A function which performs the above calculation for a single point.

The aforementioned kW correction factor can also be used to correct for RMS, if some reasonable approximations are made. The highest difference between the kW correction table and a true RMS correction table based on the same INL data was observed to be a miniscule 3 ppm, all the way from 4 mA to full scale (i.e., well beyond the range normally required for accuracy).

An additional adjustment for kW and kVAR could be applied at non-unity power factors. The value of this adjustment is equal to:

$$PF_{adj} = \frac{2}{N*A} \sum_{\substack{s=\sin(\frac{2\pi(i+0.5)}{N}), \\ c=\cos(\frac{2\pi(i+0.5)}{N}), \\ i=0 \ldots \frac{N-1}{2}}} (inl_{falling}(c) - inl_{rising}(c)) * s$$

and the adjusted correction factors for kW and kVAR become:

$$correctionFactor_{kW@PF} = correctionFactor_{kW,kVAR} \pm \frac{kVar}{kW} * PF_{adj}$$

$$correctionFactor_{kVAR@PF} = correctionFactor_{kW,kVAR} \pm \frac{kW}{kVAR} * PF_{adj}$$

Note that the actual adjustment as calculated above will be very small (and equal to 0 when the rising and falling INL's are the same). When implemented, the adjustments were all negligible on a sample meter (<30 ppm=0.003% for kW at 0.5 PF), hence this correction need not be implemented.

Each correction table may contain 181 correction points (the large size is primarily to accommodate enough resolution at the low end of the I×N gain stage). The odd size is so that values can be looked up by uncalibrated RMS value using a power-of-2 divider for processing efficiency.

The INL correction factor 'K' for a given uncalibrated RMS value 'U' is looked up using linear interpolation of the correction table for that measurement channel. The corrected RMS value is then given by K*U.

To correct uncalibrated kW and kVAR measurements, the uncalibrated values are multiplied by two independent correction factors, one for the RMS-voltage, the other for the RMS-current.

Figure 18:
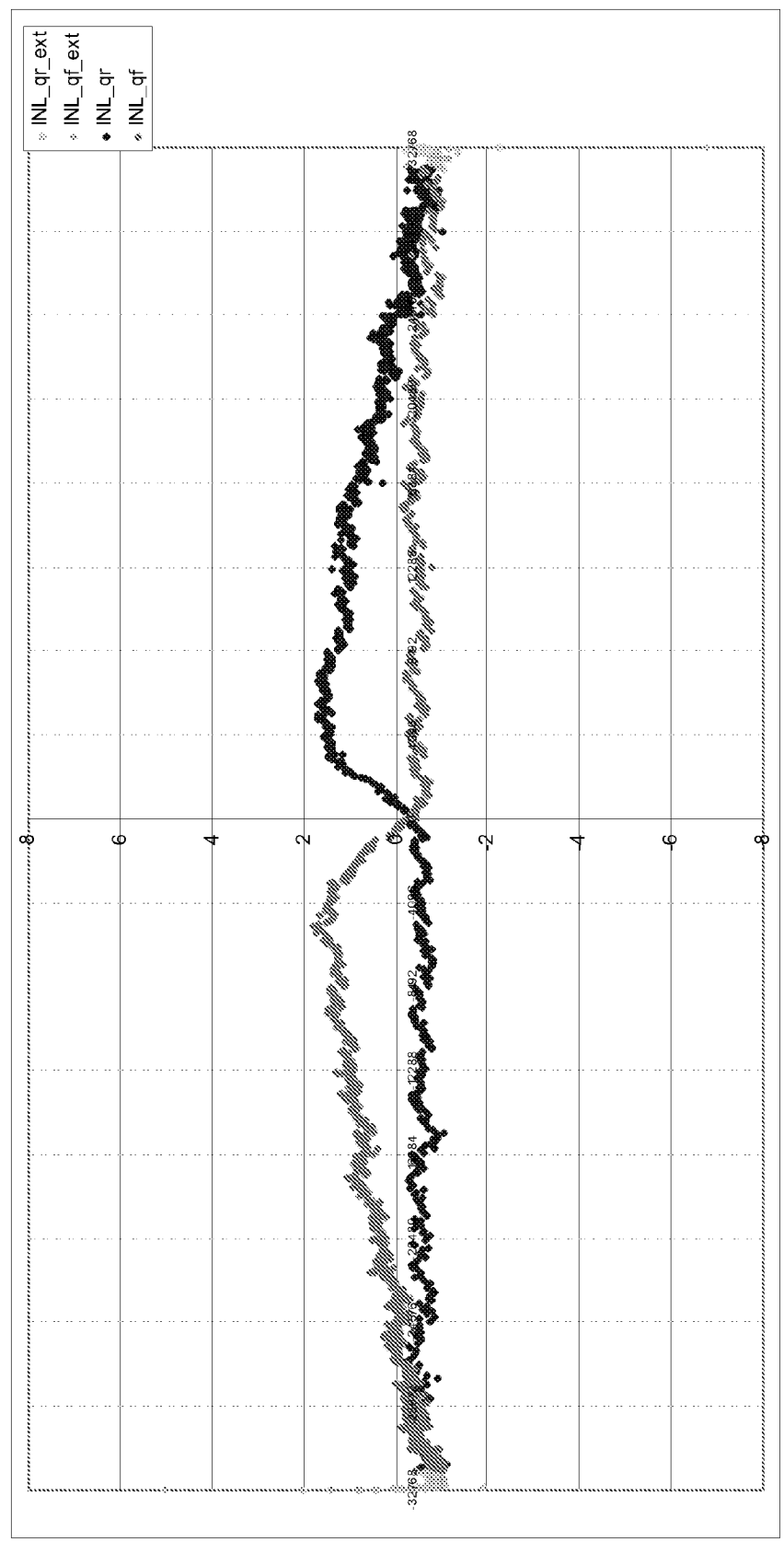
FIG. 18 depicts the non-linearity of the calibration waveform used to generate the graph of FIG. 2.

Ideally, the source waveform used to calibrate channel non-linearities will have zero intrinsic non-linearity itself. Realistically, this is typically not the case. Shown in FIG. 18 is the non-linearity of the calibration waveform used to generate FIG. 2. (Note that the distortion shown in the Figure seems to be caused by a very small amount of crossover distortion in the op-amp.)

Comparison of FIG. 2 and FIG. 18 show that the non-linearity of the calibration waveform itself features quite prominently in the calculated INL for the channel. Several options to get around this problem were considered:

(a) Use a different op-amp. This is not optimal where the type of op amp currently used was selected because of its good performance in the rest of the circuit (low noise, low total harmonic distortion ("THD"), high bandwidth, low offset voltage, low power, high output drive, rail-to-rail input and output, etc.).

(b) Measure the calibration waveform itself on spare ADC channel(s) and remove this before doing further calculations. Unfortunately, this would involve using 3 spare ADC channels (which may not be available), or expensive analog multiplexers. Also, the waveform accumulation code would have to accumulate 6 channels at once (3 current channels+3 calibration waveforms), which may overload the DSP processor with the current design.

(c) Do a multi-stage calibration. This is the approach used in the described implementation, and is further described below.

To account for the non-linearities present near the center of the calibration waveform (See FIG. 18), the effects of this non-linearity on the predicted accuracy/correction tables can be analyzed. It turns out that the effects of INL error close to the center of the waveform (i.e., low absolute sample value) are insignificant for larger currents. This makes intuitive sense, since it is the high absolute sample values that contribute the most to the sum-of-squares and dot-products used for RMS and power calculations.

Figure 19:
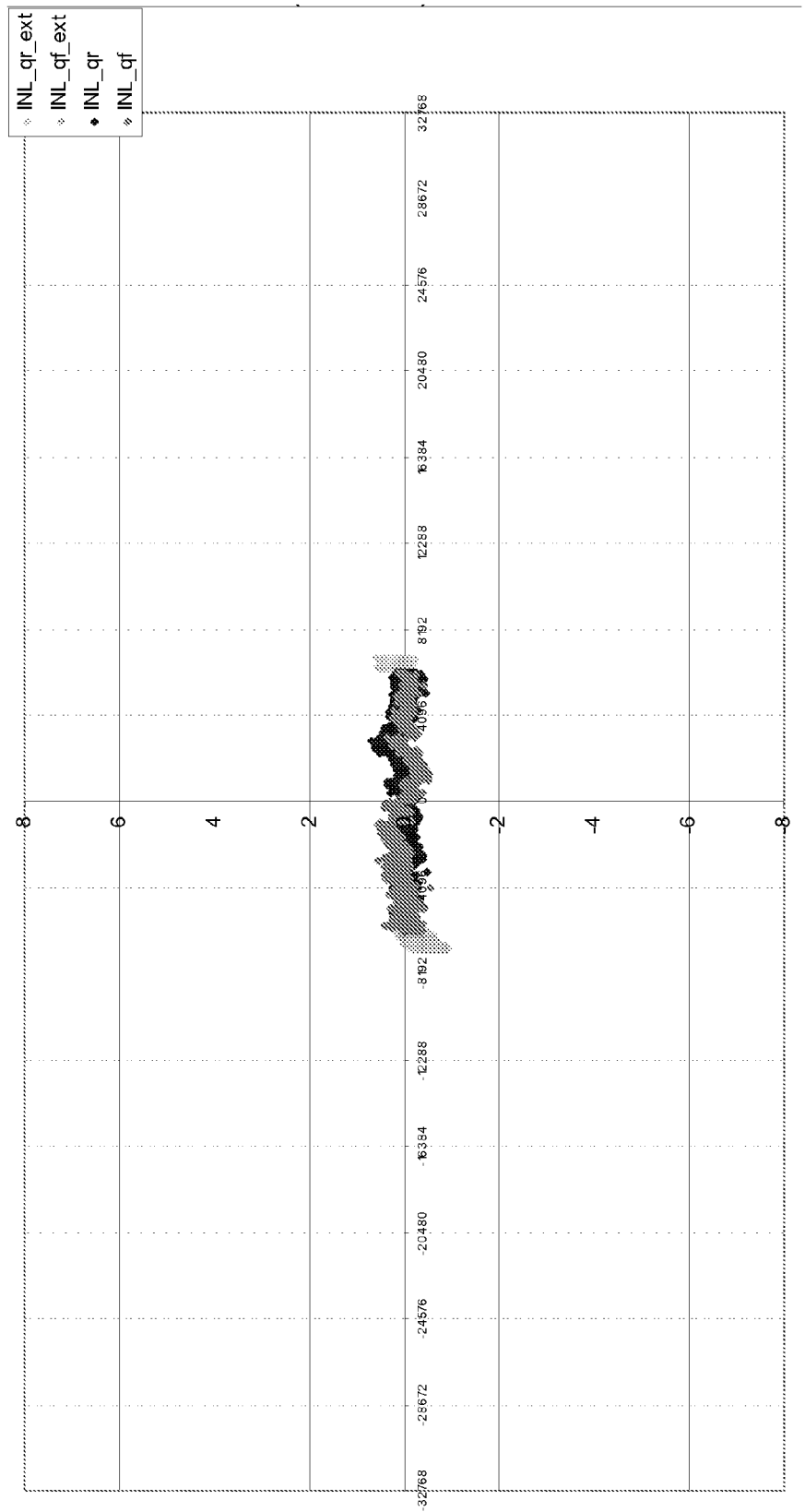
FIG. 19 depicts the reduction in the amount of crossover distortion due to reduction of the magnitude of the calibration waveform.
Figure 18:
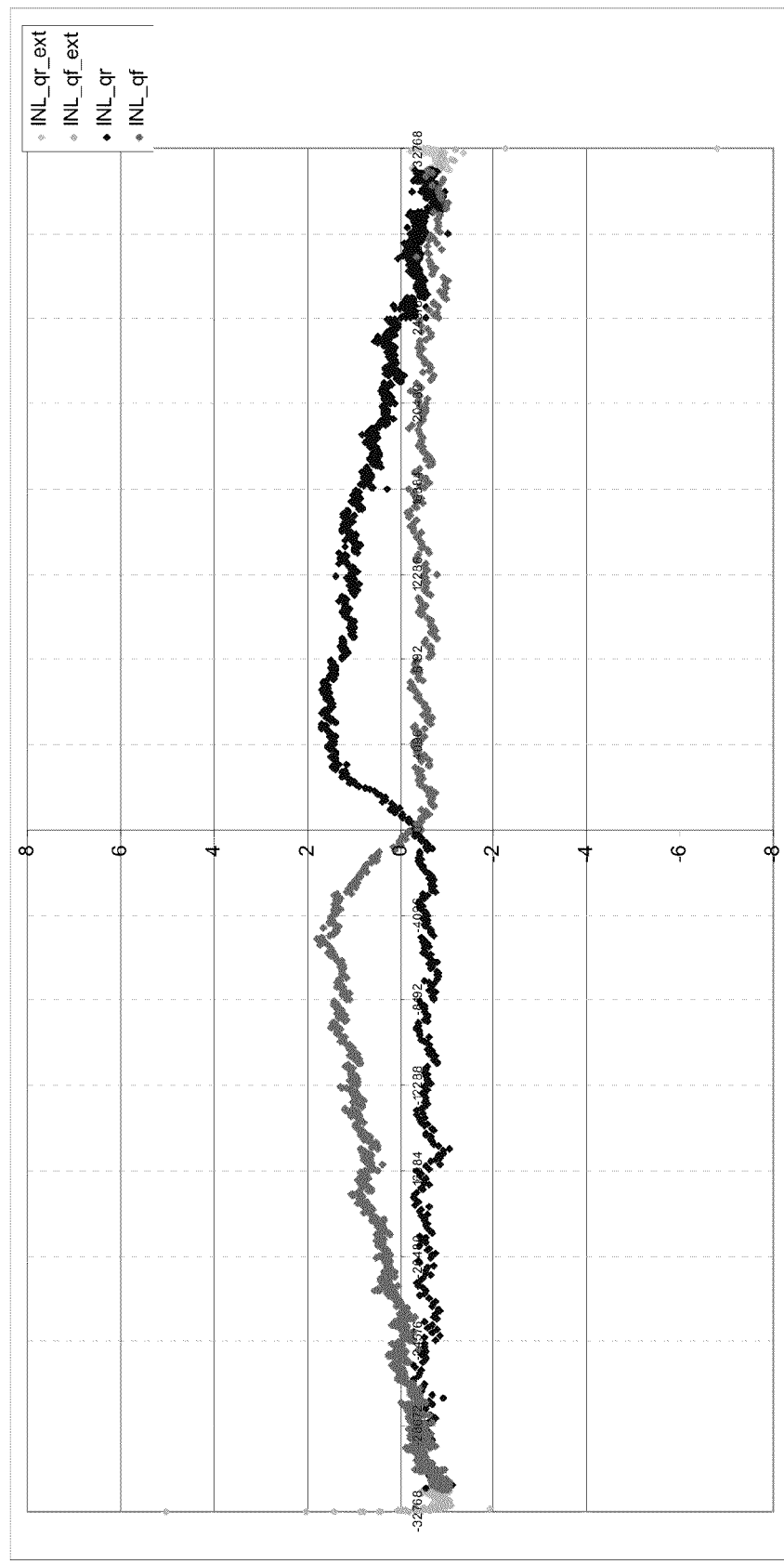
Figure 19:
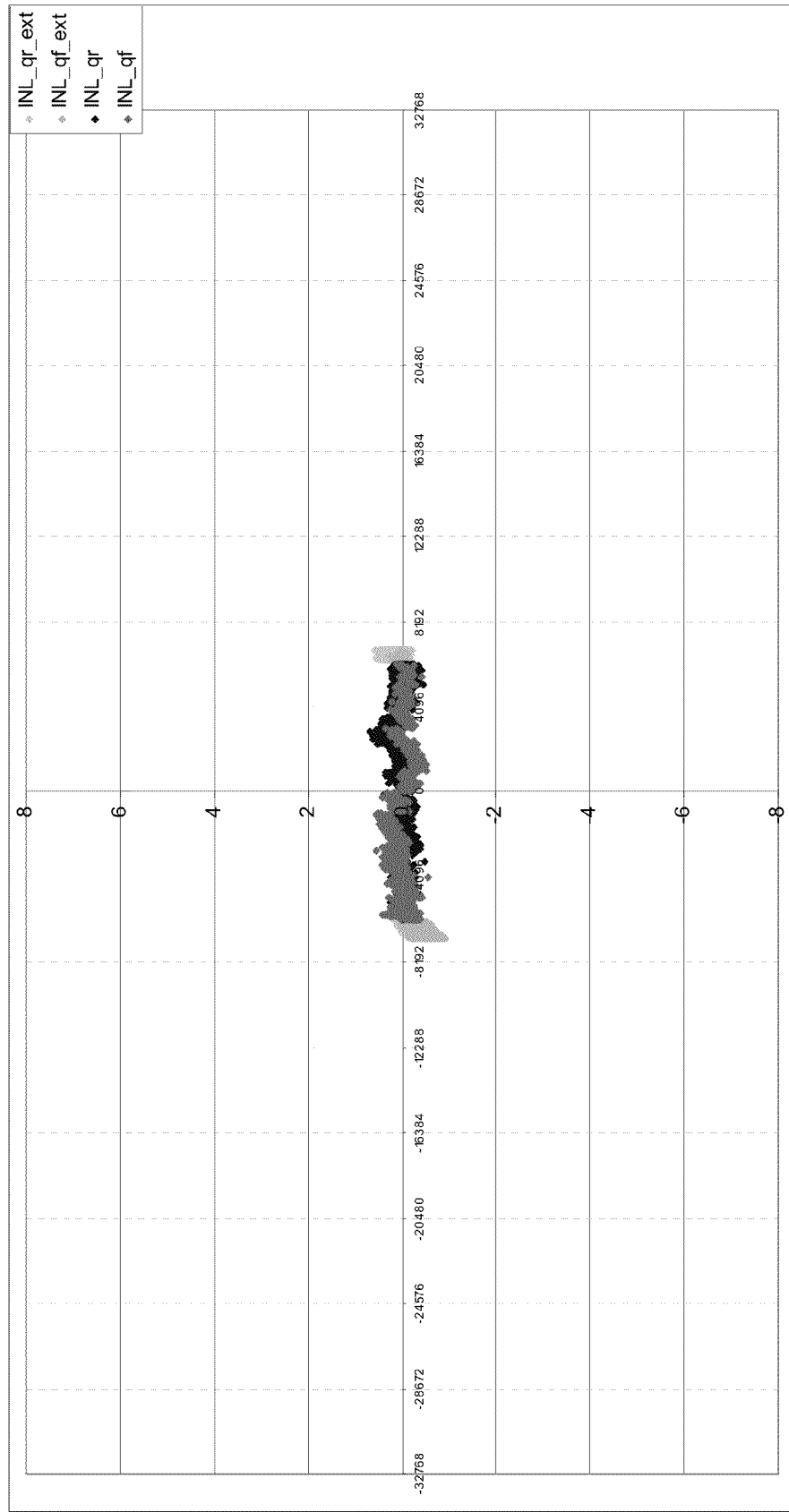

Furthermore, the amount of crossover distortion is significantly reduced when the magnitude of the calibration waveform is reduced, as can be seen in FIG. 19, where the remaining INL is dominated by the INL of the ADC used to sample this waveform.

This suggests that a multi-stage INL calibration would be successful: The first stage would produce a large calibration waveform and be used to fill in the correction table for "larger" current values. The second stage would produce a smaller calibration waveform and fill in the "smaller" current values.

Experiments show that a 2-stage calibration yields very good accuracy for I×O, and a single calibration stage is sufficient for I×N (although a 2- or even 3-stage solution may be implemented due to faster convergence and better repeatability at the low end).

As already mentioned, the calibration waveform needs to be averaged over many periods to achieve enough resolution to accurately predict % Error. The determination of the calibration convergence criteria, i.e., how long must the calibration waveform be accumulated, is as follows. A statistical analysis of how sample noise affects the predicted % Error yields the following result (with appropriate assumptions):

$$\sigma\{point\}=\sqrt{12}*RMS*\sigma\{\% \text{ Err}\},$$

where $\sigma\{point\}$=standard deviation of each point-value used in the RMS calculation (with all points' stdev's assumed equal)

$\sqrt{12}$=scale factor assuming a 12-point RMS, 12 points being the number of usable points from the calibration waveform when simulating a 10 mA sinusoidal input waveform.

RMS=RMS of the signal whose % Error is being predicted
$\sigma\{\% \text{ Err}\}$=standard deviation of the predicted % Error:

During calibration, the standard deviation $\sigma\{sample\}$ is tracked for each sample of the calibration waveform, as measured over multiple waveform periods. Averaging a sample value over 'n' periods of the waveform, provides:

$\sigma\{point\}=\sigma\{sample\}/\sqrt{n}$ to use in the above equation.

Thus, for a given target $\sigma\{\% \text{ Err}\}$, the following convergence criteria for each sample can be applied:

$$\sigma\{sample\}/\sqrt{n} \text{ must be } <\sqrt{12}*RMSmin(sample)*\sigma\{\% \text{ Err}\},$$

where

RMSmin(sample)=the smallest RMS value that would use this sample. I.e., RMSmin(sample)=|sample−Dcof−Rms|/sqrt(2), OR=the smallest RMS that is needed to be accurate for, whichever is larger.

For the described implementation, two separate $\sigma\{\% \text{ Err}\}$ targets can be applied:

$$\sigma\{\%Err\}=0.1\%/6, \text{down to 25 mA, and}$$

$$\sigma\{\%Err\}=0.2\%/6, \text{down to 10 mA},$$

and each point of the calibration waveform must satisfy both $\sigma\{\% \text{ Err}\}$ targets in order to consider the waveform to have converged.

The above convergence criteria make the repeatability of INL calibration a 6-sigma process. In actuality, the observed $\sigma\{\% \text{ Err}\}$'s are much tighter than predicted above, due primarily to the following 2 factors:

(1) Most RMS'es can use more than 12 samples of the calibration waveform for the RMS calculation, making the √12 factor an unrealistic worst-case; and
(2) Sample noise will usually be correlated from sample to sample (e.g., both timing jitter and slow DAC movement will affect each sample in the same direction), whereas the above analysis assumed a worst case of uncorrelated AWGN noise on each sample.

Nevertheless, the above convergence criteria may be used, since it represents a very conservative worst case and does not yield prohibitively long calibration times.

With respect to errors which may occur during operation of the described implementation, any of the following error conditions may result in a calibration failure:

1. ICAL_ERROR_USER_ABORT: The user aborted the calibration;
2. ICAL_ERROR_CALIBRATION_TIMEOUT: Calibration waveform(s) did not converge;
3. ICAL_ERROR_WAVEFORM_TOO_SMALL: Calibration waveform does not span the full range of the correction table to be filled on a given stage;
4. ICAL_ERROR_BAD_WAVEFORM: Can't find the best-fit exponential equation for the waveform;
5. ICAL_ERROR_CORRECTION_TOO_LARGE: A value in the calculated correction table value is too large;
6. ICAL_ERROR_PACKET_COUNT_MISMATCH: A communication error occurred;
7. ICAL_ERROR_WAITING_TO_START (+offset): Offset indicates which error occurred that prevented calibration from starting (DCO couldn't settle; external signal present/too much noise; and/or PQ task couldn't be stopped); and
8. ICAL_ERROR_UNKNOWN_STATE: The calibration state machine encountered an unknown state.

In the computer program code of the described implementation, these conditions are enumerated in a C enumerated type (which also includes ICAL_IN_PROGRESS and ICAL_ SUCCESS as its other two enumerations).

During INL calibration, status messages are output as required. During regular meter operation, readings will be adjusted by the appropriate correction factors as described above).

The disclosed implementation provides a calibration interface for factory use, including the ability to:

1. Start INL calibration;
2. Abort INL calibration;
3. Display results of last INL calibration;
4. Show/change calibration parameter(s);
5. Display all INL calibration tables;
6. Clear selected INL calibration table(s);
7. Write a portion of an INL calibration table via linear interpolation of provided parameters [will be used for programming voltage tables];
8. (Re)load INL calibration table(s) from flash memory. (For use, e.g., after an unsuccessful calibration); and
9. Save INL calibration table(s) to flash memory. (For use, e.g., after a successful calibration).

Other commands for developer use may be implemented as deemed necessary and are implementation dependent.

Upon completion of a calibration attempt, the described implementation outputs a message indicating the completion of the INL calibration attempt, and its overall status.

Successful INL calibrations, as well as other modifications to correction tables, will be logged in the event log.

An array of correction tables may be stored in flash memory. Each correction value may be stored as a 16-bit signed integer parts-per-million ("PPM") offset. Note that this limits the amount of any individual correction amount to +/−32767 ppm, i.e., 3.2767%, which is deemed sufficient for this design. Any calculated amount higher than this will result in a calibration error.

At power up, working copies of the correction tables may be calculated from the tables in flash memory. These working copies will use 'float' multipliers for speed rather than PPM adjustments.

In the described implementation, functions are implemented in the computer program code to look up and interpolate a correction factor.

While the disclosed embodiments relate to an electrical power meter, it will be appreciated that the disclosed calibration mechanisms are applicable to any intelligent electronic device which implements electrical power metering or measurement functions, including programmable logic controllers, relays, circuit monitors, and the like.

As discussed, the disclosed embodiments may generally be implemented in computer software stored in a memory and executable by a processor of an electric power meter. Alternatively or in addition, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

Although components and functions are described that may be implemented in particular embodiments with reference to particular standards and protocols, the components and functions are not limited to such standards and protocols. Such standards are periodically superseded by faster or more efficient equivalents having essentially the same functions. Accordingly, replacement standards and protocols having the same or similar functions as those disclosed herein are considered equivalents thereof.

The illustrations described herein are intended to provide a general understanding of the structure of various embodiments. The illustrations are not intended to serve as a complete description of all of the elements and features of apparatus, processors, and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, may be apparent to those of skill in the art upon reviewing the description.

The Abstract is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

I claim:

1. An intelligent electronic device operable to monitor electrical energy, the intelligent electronic device comprising:
    an enclosure;
    an analog-to-digital converter located within the enclosure and coupled with at least one sensor, the at least one sensor being operable to sense electrical energy in one or more conductors and output a corresponding electrical signal indicative thereof, the analog-to-digital converter being operative to convert the electrical signal output by the at least one sensor to at least one corresponding digital signal;
    a waveform generator located within the enclosure and operative to generate a waveform, the analog-to-digital converter being further coupled with the waveform generator to receive input therefrom; and
    a processor located within the enclosure and coupled with the analog-to-digital converter and operative to cause the analog-to-digital converter to convert the waveform to at least one corresponding digital signal, the processor being further operative to analyze the at least one digital calibration signal to identify at least one non-linear characteristic therein, and, based thereon, generate compensation data operable to cause the processor to compensate for the identified non-linear characteristic in the conversion of the electrical signal from the at least one sensor to the at least one corresponding digital signal.

2. The intelligent electronic device of claim 1, wherein the processor is further operative to compensate, based on the compensation data, for the at least one identified non-linear characteristic in the conversion of the electrical signal from the at least one sensor to the at least one corresponding digital signal.

3. The intelligent electronic device of claim 1, wherein the at least one sensor comprises one of a current sensor, a voltage sensor or a combination thereof.

4. The intelligent electronic device of claim 1, wherein the waveform comprises one of a resistance-capacitance decay, sine wave, ramp, or saw tooth.

5. The intelligent electronic device of claim 1, wherein the waveform comprises a magnitude which substantially changes over time substantially across a specified accuracy range of the intelligent electronic device.

6. The intelligent electronic device of claim 1, wherein the waveform generator is further operative to generate a plurality of waveforms spanning a measurement range of the intelligent electronic device.

7. The intelligent electronic device of claim 1, wherein the waveform generator comprises a resistance-capacitance (RC) decay generator.

8. The intelligent electronic device of claim 1, wherein the processor is further operative to calculate distortions in the at least one digital calibration signal corresponding to the waveform, and for a set of simulated sine waves each having a different magnitude within a defined range, apply the calculated distortion to each of the simulated sine waves, and compute at least one correction factor based thereon for subsequent application by the processor to the at least one corresponding digital signal converted by the analog-to-digital converter.

9. The intelligent electronic device of claim 8, wherein the processor is further operative to calculate the distortions by using a best fit curve estimation of the waveform.

10. The intelligent electronic device of claim 9, wherein the estimation is based on a least squares fit.

11. The intelligent electronic device of claim 8, wherein the processor is further operative to compute the at least one correction factor by application of the calculated distortion to a simulated sinusoidal waveform "A", calculate a dot-product of the distorted simulated sinusoidal waveform "B" with an undistorted simulated sinusoidal waveform "C", the correction factor being a function of the undistorted dot-product A•C and the distorted dot-product B•C.

12. The intelligent electronic device of claim 8, wherein the processor is further operative to compute the at least one correction factor by application of the calculated distortion to a simulated sinusoidal waveform, calculate the Root-Mean-Square value ("RMS") of the distorted simulated sinusoidal waveform, the at least one correction factor being a function of the RMS of the undistorted simulated sinusoidal waveform and the RMS of the distorted simulated sinusoidal waveform.

13. The intelligent electronic device of claim 1, wherein the conversion of the waveform to at least one corresponding digital calibration signal further comprises calculating an average of one or more cycles of the waveform over a duration of time sufficient such that the standard deviation of each sample in the averaged waveform is less than a scaled RMS of a simulated sinusoidal waveform that would contain that sample, multiplied by a scaled targeted error allowance.

14. The intelligent electronic device of claim 1, wherein the waveform comprises sufficient cycles to correct for distortions smaller than one least significant bit of the analog-to-digital converter.

15. A method of calibrating an intelligent electronic device operable to monitor electrical energy, the intelligent electronic device comprising an enclosure and an analog-to-digital converter located within the enclosure and coupled with at least one sensor, the at least one sensor being operable to sense electrical energy in one or more conductors and output a corresponding electrical signal indicative thereof, the analog-to-digital converter being operative to convert the electrical signal output by the at least one sensor to at least one corresponding digital signal, the method comprising:
    generating, within the enclosure, a calibration waveform;
    converting, by the analog-to-digital converter, the calibration waveform to at least one corresponding calibration digital signal; and analyzing the at least one calibration digital signal to identify at least one non-linear characteristic therein, and, based thereon, generating compensation data operable to compensate for the identified non-linear characteristic in the conversion of the electrical signal from the at least one sensor to the at least one corresponding digital signal.

16. The method of claim 15, further comprising compensating, based on the compensation data, for the at least one identified non-linear characteristic in the conversion of the electrical signal from the at least one sensor to the at least one corresponding digital signal.

17. The method of claim 15, wherein the at least one sensor comprises one of a current sensor, a voltage sensor or a combination thereof.

18. The method of claim 15, wherein the calibration waveform comprises one of a resistance-capacitance decay, sine wave, ramp, or saw tooth.

19. The method of claim 15, wherein the calibration waveform comprises a magnitude which substantially changes over time substantially across a specified accuracy range of the intelligent electronic device.

20. The method of claim 15, wherein the generating further comprises generating a plurality of calibration waveforms spanning a measurement range of the intelligent electronic device.

21. The method of claim 15, wherein the generating further comprises generating the calibration waveform using an RC decay generator.

22. The method of claim 15, wherein the generating of compensation data further comprises calculating distortions in the at least one calibration digital signal corresponding to the calibration waveform, and for a set of simulated sine waves each having a different magnitude within a defined range, applying the calculated distortion to each of the simulated sine waves, and computing at least one correction factor based thereon for subsequent application to the at least one digital signal converted by the analog-to-digital converter.

23. The method of claim 22, wherein the calculating distortions further comprises using a best fit curve estimation of the calibration waveform.

24. The method of claim 23, wherein the estimation is based on a least squares fit.

25. The method of claim 22, wherein the computing of the at least one correction factor further comprises applying the calculated distortion to a simulated sinusoidal waveform "A", calculating a dot-product of the distorted simulated sinusoidal waveform "B" with an undistorted simulated sinusoidal waveform "C", the correction factor being a function of the undistorted dot-product A•C and the distorted dot-product B•C.

26. The method of claim 22, wherein the computing of the at least one correction factor further comprises applying the calculated distortion to a simulated sinusoidal waveform, calculating the Root-Mean-Square value ("RMS") of the distorted simulated sinusoidal waveform, the at least one correction factor being a function of the RMS of the undistorted simulated sinusoidal waveform and the RMS of the distorted simulated sinusoidal waveform.

27. The method of claim 15, wherein the converting further comprises calculating an average of one or more cycles of the calibration waveform over a duration of time sufficient such that the standard deviation of each sample in the averaged waveform is less than a scaled RMS of a simulated sinusoidal waveform that would contain that sample, multiplied by a scaled targeted error allowance.

28. The method of claim 15, wherein the calibration waveform comprises sufficient cycles to correct for distortions smaller than one least significant bit of the analog-to-digital converter.

29. An intelligent electronic device operable to monitor electrical energy, the intelligent electronic device comprising:
a circuit board;
an analog-to-digital converter located on the circuit board and coupled with at least one sensor, the at least one sensor being operable to sense electrical energy in one or more conductors and output a corresponding electrical signal indicative thereof, the analog-to-digital converter being operative to convert the electrical signal output by the at least one sensor to at least one corresponding digital signal;
means for generating a waveform, located on the circuit board, the analog-to-digital converter being further coupled with the means for generating to receive input therefrom; and
means for causing the analog-to-digital converter to convert the waveform to at least one corresponding digital calibration signal, analyze the at least one digital calibration signal to identify at least one non-linear characteristic therein, and, based thereon, generate compensation data operable to compensate for the identified non-linear characteristic in the conversion of the electrical signal from the at least one sensor to the at least one corresponding digital signal.

30. A power monitoring apparatus operable to monitor electrical energy, the apparatus comprising:
a circuit board arrangement configured to be enclosed in a housing of a power meter;
a calibration waveform generator circuit disposed on the circuit board arrangement and providing a calibration waveform;
an analog-to-digital converter (ADC) disposed on the circuit board arrangement and configured to be coupled with at least one sensor, the sensor being operable to sense electrical energy in one or more conductors and output a corresponding electrical sensor signal, the ADC being operative to convert the electrical sensor signal to a corresponding digital sensor signal, the ADC being further coupled to the calibration waveform generator circuit and operative to convert the calibration waveform to a corresponding digital calibration signal; and
a processor disposed on the circuit board arrangement and coupled to the ADC, the processor configured to be operative to analyze the digital calibration signal to identify a non-linear characteristic therein, and, based thereon, generate compensation data that can be used by the processor to compensate for the identified non-linear characteristic during the conversion of the electrical sensor signal to the corresponding digital sensor signal.

31. The power monitoring apparatus of claim 30, wherein the processor is further operative to compensate, based on the compensation data, for the identified non-linear characteristic in the conversion of the electrical sensor signal from the sensor to the corresponding digital sensor signal.

32. The power monitoring apparatus of claim 30, wherein the sensor comprises one of a current sensor, a voltage sensor or a combination thereof.

33. The power monitoring apparatus of claim 30, wherein the calibration waveform comprises one of a resistance-capacitance decay, sine wave, ramp, saw tooth, or combination thereof.

34. The power monitoring apparatus of claim 30, wherein the calibration waveform comprises a magnitude which substantially changes over time substantially across a specified accuracy range of the power monitoring apparatus.

35. The power monitoring apparatus of claim 30, wherein the calibration waveform generator is further operative to generate a plurality of calibration waveforms spanning a measurement range of the power monitoring apparatus.

36. The power monitoring apparatus of claim 30, wherein the calibration waveform generator comprises an RC decay generator.

37. The power monitoring apparatus of claim 30, wherein the processor is further operative to calculate distortions in the at least one digital calibration signal corresponding to the calibration waveform, and for a set of simulated sine waves each having a different magnitude within a defined range, apply the calculated distortion to each of the simulated sine waves, and compute at least one correction factor based thereon for subsequent application by the processor to the at least one corresponding digital signal converted by the analog-to-digital converter.

* * * * *